US012796065B2

(12) United States Patent
Song et al.

(10) Patent No.: US 12,796,065 B2
(45) Date of Patent: Nov. 10, 2026

(54) ELECTROSTATIC DISCHARGE PROTECTION DEVICE

(71) Applicant: Samsung Electronics Co., Ltd., Suwon-si (KR)

(72) Inventors: Jongkyu Song, Suwon-si (KR); Jin Heo, Suwon-si (KR); Minho Kim, Suwon-si (KR); Jooyoung Song, Suwon-si (KR); Eunsuk Lee, Suwon-si (KR); Chanhee Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 384 days.

(21) Appl. No.: 18/515,524

(22) Filed: Nov. 21, 2023

(65) Prior Publication Data

US 2024/0312985 A1 Sep. 19, 2024

(30) Foreign Application Priority Data

Mar. 13, 2023 (KR) ........................ 10-2023-0032776

(51) Int. Cl.
*H10D 84/60* (2025.01)

(52) U.S. Cl.
CPC ......... *H10D 84/619* (2025.01); *H10D 84/676* (2025.01)

(58) Field of Classification Search
None
See application file for complete search history.

(56) References Cited

U.S. PATENT DOCUMENTS

| | | | |
|---|---|---|---|
| 6,066,879 | A | 5/2000 | Lee et al. |
| 6,756,642 | B2 | 6/2004 | Lee et al. |
| 7,795,047 | B1 | 9/2010 | Vashchenko et al. |
| 9,041,054 | B2 | 5/2015 | Wijmeersch et al. |
| 9,231,403 | B2 | 1/2016 | Edwards et al. |
| 9,385,115 | B2 | 7/2016 | Notermans et al. |
| 9,666,700 | B2 | 5/2017 | Hebert et al. |

(Continued)

FOREIGN PATENT DOCUMENTS

| | | |
|---|---|---|
| CN | 104409457 A | 3/2015 |
| CN | 108807364 A | 11/2018 |

(Continued)

OTHER PUBLICATIONS

Machine Translation of CN 108879632 (Year: 2018).*
Machine Translation of CN 108807364 (Year: 2018).*

*Primary Examiner* — Anthony Ho
(74) *Attorney, Agent, or Firm* — Muir Patent Law, PLLC

(57) ABSTRACT

Disclosed is an electrostatic discharge protection device which includes a substrate including a first well having a first conductivity type and a second well surrounding the first well, first to fifth diffusion regions formed on the first well, and sixth and seventh diffusion regions formed on the second well. The second diffusion region surrounds the first diffusion region, the fourth diffusion region surrounds the fifth diffusion region, and the fifth diffusion region surrounds the second diffusion region and the fourth diffusion region. The sixth diffusion region surrounds the fifth diffusion region, and the seventh diffusion region surrounds the sixth diffusion region. The sixth and seventh diffusion regions are connected to an anode electrode, and the first to fifth diffusion regions are connected a cathode electrode.

20 Claims, 29 Drawing Sheets

(56) References Cited

U.S. PATENT DOCUMENTS

| | | | |
|---|---|---|---|
| 10,211,196 | B2 | 2/2019 | Ko et al. |
| 10,211,198 | B2 | 2/2019 | Hung et al. |
| 2006/0011939 | A1 | 1/2006 | Mohn et al. |
| 2009/0166721 | A1 | 7/2009 | Denison et al. |
| 2012/0199874 | A1 | 8/2012 | Salcedo et al. |
| 2022/0231126 | A1 | 7/2022 | Song et al. |

FOREIGN PATENT DOCUMENTS

| | | | |
|---|---|---|---|
| CN | 108879632 | A | 11/2018 |
| KR | 10-2198639 | B1 | 1/2021 |
| KR | 10-2215312 | B1 | 2/2021 |
| TW | 200705640 | A | 2/2007 |

* cited by examiner

ELECTROSTATIC DISCHARGE PROTECTION DEVICE

CROSS-REFERENCE TO RELATED APPLICATION

This application claims priority under 35 U.S.C. § 119 to Korean Patent Application No. 10-2023-0032776 filed on Mar. 13, 2023, in the Korean Intellectual Property Office, the disclosure of which is incorporated by reference herein in their entireties.

BACKGROUND

Embodiments of the present disclosure described herein relate to a thyristor-based electrostatic discharge protection device.

An electrostatic discharge protection device that is a silicon controlled rectifier (SCR) (or thyristor) is triggered by the reverse breakdown between an N-well and a P-well and has a trigger voltage of a relatively high level. In addition, a typical silicon controlled rectifier-based electrostatic discharge protection device has a holding voltage of a relatively low level due to an internal parasitic bipolar junction transistor (BJT).

Meanwhile, in some cases, a trigger voltage of a high level may be required depending on the specifications of a required product. A method of adjusting a distance between the P-well and the N-well, in which the reverse breakdown occurs, may be used to design an electrostatic discharge protection device that has a trigger voltage of a high level. However, when a value of the trigger voltage is increased by increasing the distance between the P-well and the N-well, the electrostatic discharge protection device may not operate properly due to a decrease in a current gain.

Accordingly, to meet product specifications, it is very important to design an electrostatic discharge protection device, which operates stably at a trigger voltage of a high level, in terms of reliable protection of the electronic device.

SUMMARY

Embodiments of the present disclosure provide an electrostatic discharge (ESD) protection device capable of efficiently discharging an ESD current of a high value.

In accordance with an aspect of the disclosure, an electrostatic discharge protection device includes a substrate having a first conductivity type; a first well formed on the substrate and having the first conductivity type; a second well formed on the substrate surrounding the first well in a plan view, the second well having a second conductivity type; a first diffusion region formed on the first well and having the first conductivity type; a second diffusion region formed on the first well surrounding the first diffusion region in the plan view, the second diffusion region having the second conductivity type; a third diffusion region formed on the first well and having the first conductivity type; a fourth diffusion region formed on the first well surrounding the third diffusion region in the plan view, the fourth diffusion region having the second conductivity type; a fifth diffusion region formed on the first well surrounding the second diffusion region and the third diffusion region in the plan view, the fifth diffusion region having the first conductivity type; a sixth diffusion region formed on the second well to surround the fifth diffusion region in the plan view, the sixth diffusion region having the first conductivity type; and a seventh diffusion region formed on the second well surrounding the sixth diffusion region in the plan view, the seventh diffusion region having the second conductivity type, wherein the sixth diffusion region and the seventh diffusion region are connected to a first electrode, and the first diffusion region to the fourth diffusion region are connected to a second electrode.

In accordance with an aspect of the disclosure, an electrostatic discharge protection device includes a substrate of a first conductivity type; a first well formed on the substrate and having the first conductivity type; a second well formed on the substrate surrounding the first well in a plan view, the second well having a second conductivity type; a first diffusion region and a second diffusion region formed on the first well and having the second conductivity type; a third diffusion region formed on the first well surrounding the first diffusion region and the second diffusion region in the plan view, the third diffusion region having the first conductivity type; a fourth diffusion region formed on the second well surrounding the third diffusion region in the plan view, the fourth diffusion region having the first conductivity type; and a fifth diffusion region formed on the second well surrounding the fourth diffusion region in the plan view, the fifth diffusion region having the second conductivity type, wherein the fourth diffusion region and the fifth diffusion region are connected to a first electrode, and the first diffusion region to the third diffusion region are connected to a second electrode.

In accordance with an aspect of the disclosure, an electrostatic discharge protection device includes a first well formed on a substrate and having a first conductivity type; a second well formed on the substrate surrounding the first well in a plan view, the second well having a second conductivity type; a first diffusion region and a second diffusion region formed on the first well and having the second conductivity type; a third diffusion region formed on the first well surrounding the first diffusion region and the second diffusion region in the plan view, the third diffusion region having the first conductivity type; a fourth diffusion region formed on the second well surrounding the third diffusion region in the plan view, the fourth diffusion region having the first conductivity type; a fifth diffusion region formed on the second well surrounding the fourth diffusion region in the plan view, the fifth diffusion region having the second conductivity type; a third well formed on the substrate and having the first conductivity type; a fourth well formed on the substrate surrounding the third well in the plan view, the fourth well having the second conductivity type; a sixth diffusion region and a seventh diffusion region formed on the third well and having the second conductivity type; an eighth diffusion region formed on the third well surrounding the sixth diffusion region and the seventh diffusion region in the plan view, the eighth diffusion region having the first conductivity type; a ninth diffusion region formed on the fourth well surrounding the eighth diffusion region in the plan view, the ninth diffusion region having the first conductivity type; and a tenth diffusion region formed on the fourth well surrounding the ninth diffusion region in the plan view, the tenth diffusion region having the second conductivity type, wherein the first diffusion region, the second diffusion region, the third diffusion region, the ninth diffusion region, and the tenth diffusion region are electrically connected to each other, and wherein the fourth diffusion region and the fifth diffusion region are connected to a first electrode, and the sixth diffusion region and the seventh diffusion region are connected to a second electrode.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one of ordinary skill in the art may easily carry out the present disclosure.

It will be understood that when an element is referred to as being “connected”, “coupled”, or “adjacent” to another element, it can be directly connected, coupled, or adjacent to another element or intervening element or can be “indirectly connected”, “indirectly coupled”, or “indirectly adjacent”, with another element or layer interposed therebetween. As used herein, the term “and/or” may include one or more combinations of listed items.

Even though the terms “first”, “second”, etc. may be used herein to describe various elements, it should be understood that these elements should not be limited by these terms. These terms may be used only to distinguish one element from another element. Accordingly, the term “first element”, “first section”, “first layer”, etc. used in the specification could be termed a “second element”, “second section”, “second layer”, etc. without departing from the teachings of the invention.

Figure 1:
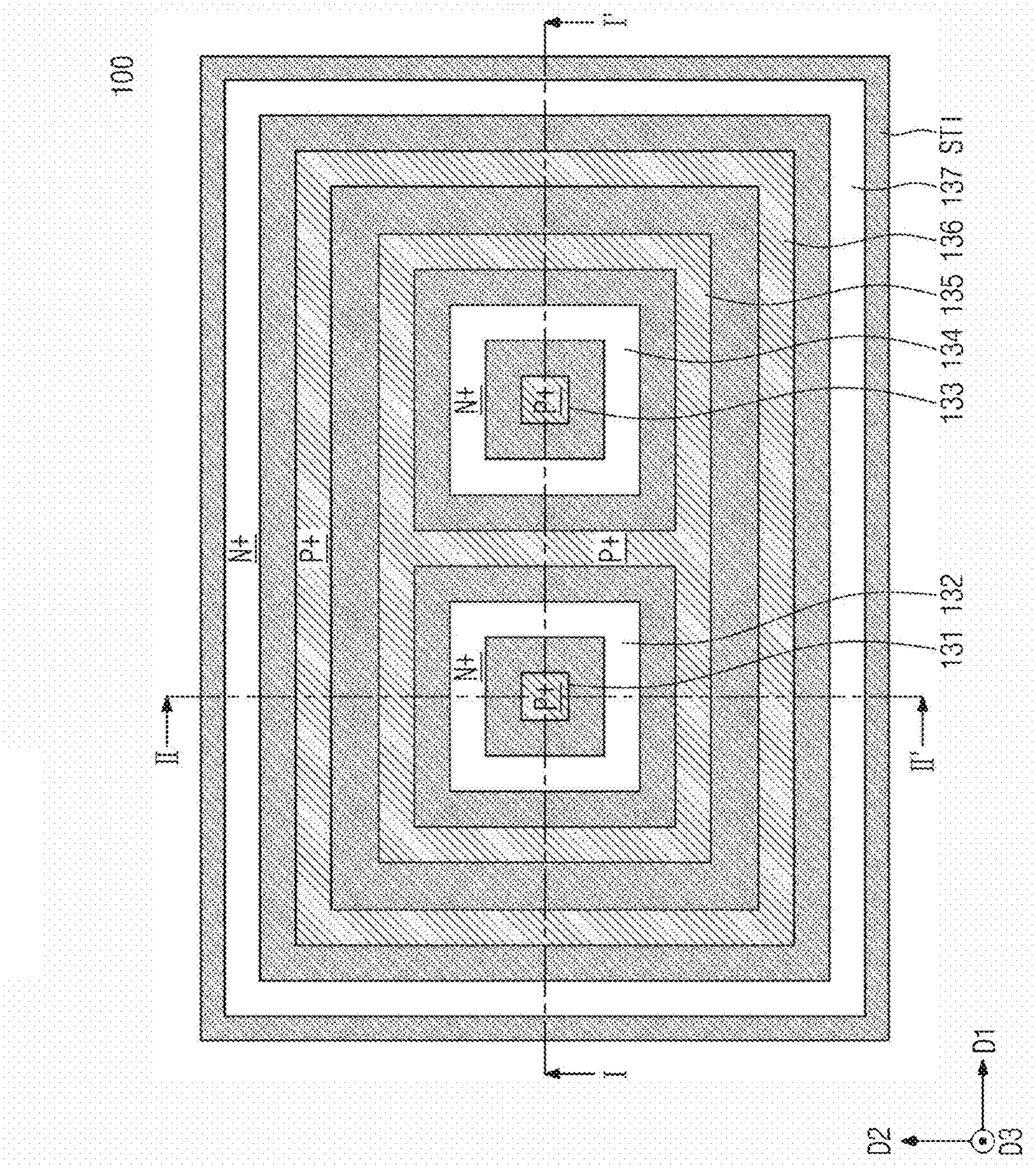
FIG. 1 illustrates a plan view of an ESD protection device according to an embodiment of the present disclosure.
Figure 2:
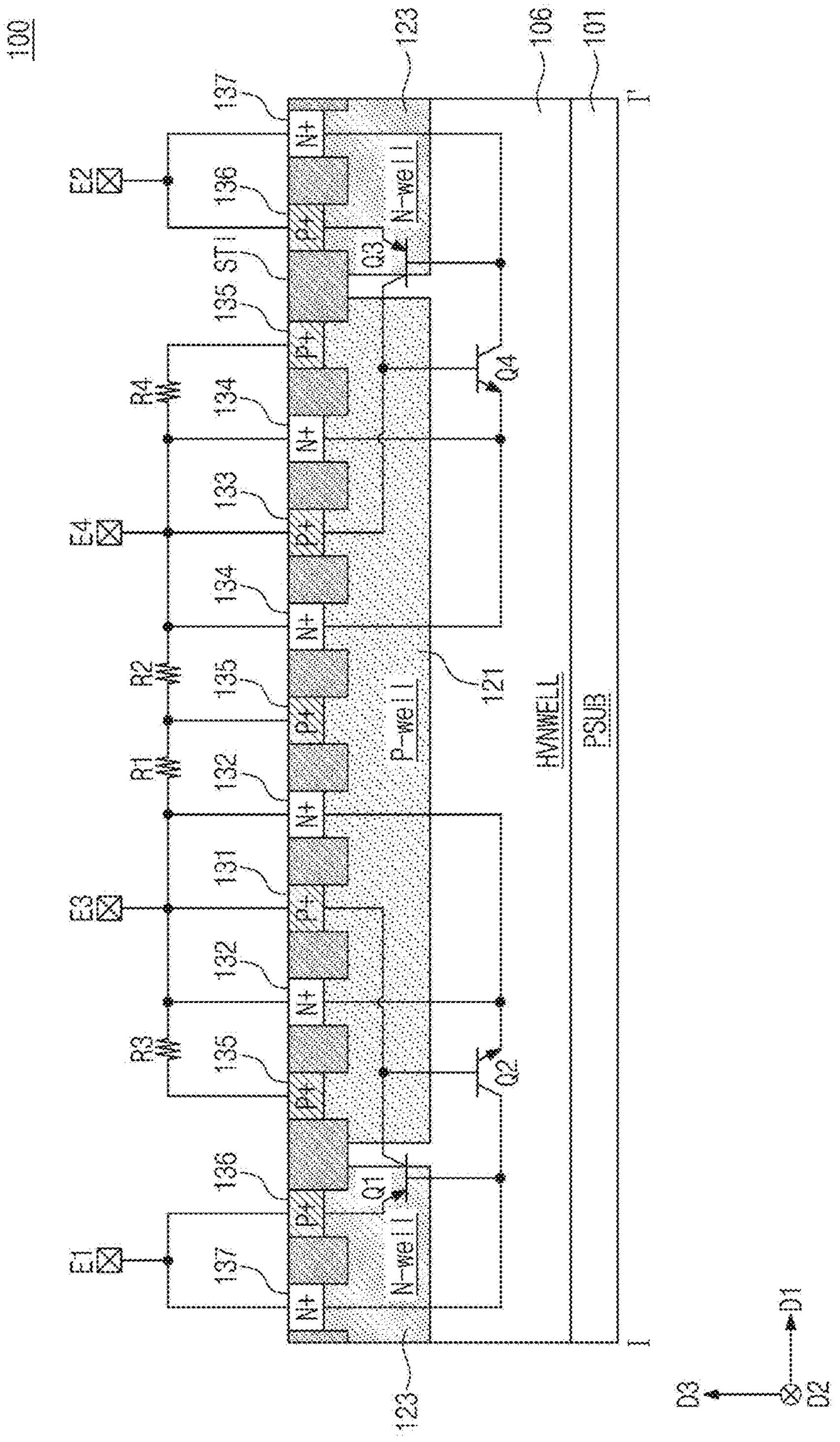
FIG. 2 illustrates a cross-sectional view of an ESD protection device taken along line I-I' of FIG. 1.
Figure 3:
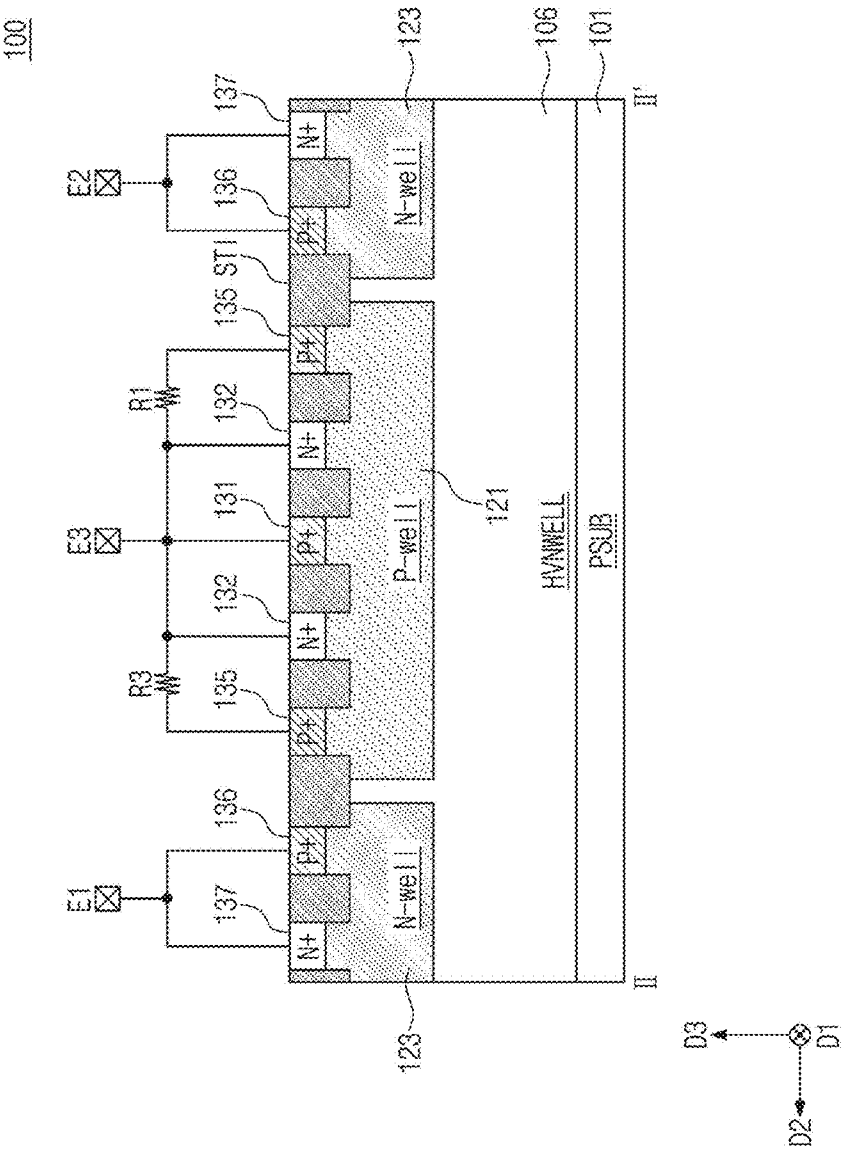
FIG. 3 illustrates a cross-sectional view of an ESD protection device taken along line II-II' of FIG. 1.

FIG. 1 illustrates a plan view of an ESD protection device 100 according to an embodiment of the present disclosure. FIG. 2 illustrates a cross-sectional view of the ESD protection device 100 taken along line I-I' of FIG. 1. FIG. 3 illustrates a cross-sectional view of an ESD protection device 100 taken along line II-II' of FIG. 1.

Referring to FIGS. 1, 2, and 3, the ESD protection device 100 may include a substrate 101, a high voltage N-well (HVNWELL) 106, a P-well 121, an N-well 123, a first diffusion region 131, a second diffusion region 132, a third diffusion region 133, a fourth diffusion region 134, a fifth diffusion region 135, a sixth diffusion region 136, and a seventh diffusion region 137.

The substrate 101 may be a crystalline semiconductor substrate such as a semiconductor wafer. The substrate 101 may be a bulk silicon substrate, a silicon-on-insulator (SOI) substrate, a germanium substrate, a germanium-on-insulator (GOI) substrate, or a silicon-germanium substrate. For example, the substrate 101 may include at least one of silicon (Si), germanium (Ge), silicon germanium (SiGe), gallium arsenide (GaAs), indium gallium arsenide (InGaAs), aluminum gallium arsenide (AlGaAs), or a mixture thereof. The substrate 101 may have a single crystal structure. The substrate 101 may be doped with P-type impurities (i.e., a charge carrier dopant) of a low concentration.

The N-well 106 may be formed on the substrate 101. The dopant concentration of the N-well 106 may be higher than the dopant concentration of the substrate 101, and the N-well 106 may be a high-voltage N-well.

The P-well 121 may be formed on the N-well 106, and the N-well 123 may be formed on the N-well 106 to surround the P-well 121. That is, in FIG. 2, the N-well 123 may extend along a second direction D2; in FIG. 3, the N-well 123 may extend along a first direction D1. The P-well 121 and the N-well 123 may be spaced from each other along the first direction D1 and the second direction D2. The P-well 121 may be doped with P-type impurities, and the N-well 123 may be doped with N-type impurities. For example, the dopant concentration of the P-well 121 and the dopant concentration of the N-well 123 may be higher than the dopant concentration of the N-well 106.

In an embodiment, the N-well 123 and the P-well 121 may be disposed to be spaced from each other, not adjacent to each other. For example, as the N-well 123 and the P-well 121 are disposed not to contact each other, a value of the trigger voltage of the ESD protection device 100 may increase compared to the case where the P-well 121 and the N-well 123 contact each other.

The first diffusion region 131 may be formed on the P-well 121. The second diffusion region 132 may be formed on the P-well 121, and the second diffusion region 132 may surround the first diffusion region 131 in a plan view (see, e.g., FIG. 1). The first diffusion region 131 may be doped with P-type impurities to have a P-type conductivity, and the second diffusion region 132 may be doped with N-type impurities to have an N-type conductivity. For example, the dopant concentration of the first diffusion region 131 and the dopant concentration of the second diffusion region 132 may be higher than the dopant concentration of the P-well 121.

The third diffusion region 133 may be formed on the P-well 121. The first diffusion region 131 and the third diffusion region 133 may be disposed to be spaced from each other in the first direction D1. The fourth diffusion region 134 may be formed on the P-well 121, and the fourth diffusion region 134 may surround the third diffusion region 133 in a plan view. The second diffusion region 132 and the fourth diffusion region 134 may be disposed to be spaced from each other in the first direction D1. The third diffusion region 133 may be doped with P-type impurities, and the fourth diffusion region 134 may be doped with N-type impurities. The dopant concentration of the third diffusion region 133 and the dopant concentration of the fourth diffusion region 134 may be higher than the dopant concentration of the P-well 121.

The fifth diffusion region 135 may be formed on the P-well 121. The fifth diffusion region 135 may surround the second diffusion region 132 and the fourth diffusion region 134 in a plan view. For example, the fifth diffusion region 135 may surround each of the second diffusion region 132 and the fourth diffusion region 134 in a plan view and may extend between the second diffusion region 132 and the fourth diffusion region 134. The dopant concentration of the fifth diffusion region 135 may be higher than the dopant concentration of the P-well 121.

The first diffusion region 131, the second diffusion region 132, the third diffusion region 133, the fourth diffusion region 134, and the fifth diffusion region 135 may be electrically separated (or isolated) from each other by a shallow trench isolation STI. However, the shallow trench isolation STI does not exclude a flow of a current according to an operation of a thyristor (i.e., a silicon controlled rectifier SCR) that is formed by parasitic BJTs (e.g., Q1, Q2, Q3, and Q4) to be described later.

The sixth diffusion region 136 may be formed on the N-well 123. The seventh diffusion region 137 may be formed on the N-well 123. The sixth diffusion region 136 may surround the fifth diffusion region 135 in a plan view, and the seventh diffusion region 137 may surround the sixth diffusion region 136 in a plan view. The dopant concentration of the sixth diffusion region 136 and the dopant concentration of the seventh diffusion region 137 may be higher than the dopant concentration of the N-well 123.

The sixth diffusion region 136 and the seventh diffusion region 137 may be electrically connected to each other. To this end, a metal interconnection and/or a via for electrical connection may be used. The sixth diffusion region 136 and the seventh diffusion region 137 may be connected to a first electrode E1 and a second electrode E2. The first electrode E1 and the second electrode E2 may be an anode electrode receiving an electrostatic discharge (ESD) voltage.

The first diffusion region 131 to the fifth diffusion region 135 may be electrically connected to each other, for example, through a metal interconnection and/or a via. The first diffusion region 131 to the fifth diffusion region 135 may be connected to a third electrode E3 and a fourth electrode E4. The third electrode E3 and the fourth electrode E4 may be a cathode electrode connected to a ground node.

Although the first electrode E1 and the second electrode E2 are illustrated as the anode electrode and the third electrode E3 and the fourth electrode E4 are illustrated as the cathode electrode, the number of electrodes is not limited thereto.

In an embodiment, at least one resistor may be connected between the second diffusion region 132 and the fifth diffusion region 135. An embodiment in which a first resistor R1 and a third resistor R3 are connected between the second diffusion region 132 and the fifth diffusion region 135 is illustrated as an example. At least one resistor may be connected between the fourth diffusion region 134 and the fifth diffusion region 135. An embodiment in which a second resistor R2 and a fourth resistor R4 are connected therebetween is illustrated. The resistors R1 to R4 may cause a voltage drop when the ESD current (or voltage) is introduced, thus making it easy to trigger the thyristor.

In an embodiment, a length of the fifth diffusion region 135 in the first direction D1 may be set in advance to determine a breakdown voltage of the ESD protection device 100. For example, as the length of the fifth diffusion region 135 in the first direction D1 increases, a value of the breakdown voltage of the ESD protection device 100 may become greater. In contrast, as the length of the fifth diffusion region 135 in the first direction D1 decreases, a value of the breakdown voltage of the ESD protection device 100 may become smaller.

Referring to an equivalent circuit diagram illustrated in FIG. 2, the sixth diffusion region 136 connected to the first electrode E1, the N-well 123, and the P-well 121 may constitute a PNP transistor Q1. The N-well 123 connected to the first electrode E1 through the diffusion regions 136 and 137, the P-well 121, and the second diffusion region 132 may constitute an NPN transistor Q2. As in the above description, the sixth diffusion region 136 connected to the second electrode E2, the N-well 123, and the P-well 121 may constitute a PNP transistor Q3, and the N-well 123, the P-well 121, and the fourth diffusion region 134 may constitute an NPN transistor Q4.

In detail, the N-well 123, the sixth diffusion region 136 connected to the first electrode E1, and the P-well 121 may respectively form a base, an emitter, and a collector of the PNP transistor Q1, and the P-well 121, the second diffusion region 132, and the N-well 123 may respectively form a base, an emitter, and a collector of the NPN transistor Q2. As in the above description, the N-well 123, the sixth diffusion region 136 connected to the second electrode E2, and the P-well 121 may respectively form a base, an emitter, and a collector of the PNP transistor Q3, and the P-well 121, the fourth diffusion region 134, and the N-well 123 may respectively form a base, an emitter, and a collector of the NPN transistor Q4.

To describe an operation of the ESD protection device 100, assuming that the ESD voltage is input through the first electrode E1 and the second electrode E2, a potential of the N-well 123 increases. As a result, the N-well 123 and the P-well 121 may be in a reverse bias state, and a depletion region may be formed. As the ESD current is continuously input, an electric field formed in the depletion region may exceed a threshold point; in this case, reverse breakdown (e.g., avalanche breakdown) may occur between the N-well 123 and the P-well 121. That is, electron-hole pairs (EHPs) may be generated in the depletion region, and thus, a hole current may be generated by the generated carriers (i.e., EPHs).

As the hole current first flows through an internal resistance (not illustrated) of the P-well 121, a voltage drop occurs. In this case, as a diode formed by a PN junction between the P-well 121 and the second diffusion region 132 is turned on by the voltage of the P-well 121, the NPN transistor Q2 may be turned on. The hole current flows through an internal resistance (not illustrated) of the N-well 123, and thus, a voltage drop occurs. In this case, as a diode formed by a PN junction between the N-well 123 and the sixth diffusion region 136 formed on the N-well 123 is turned on by the voltage of the N-well 123, the PNP transistor Q1 may be turned on.

According to the above description, a positive feedback operation may be maintained while two parasitic transistors Q1 and Q2 mutually provide a base current, and thus, the ESD protection device 100 may enter a latch mode. In the latch mode of the ESD protection device 100, as a current discharge path is formed through the transistors Q1 and Q2, the ESD current may be discharged through the third electrode E3 and the fourth electrode E4. The above operations may also occur in the transistors Q3 and Q4.

According to the above embodiment, a value of the breakdown voltage of the ESD protection device 100 may be efficiently adjusted. For example, in a conventional ESD protection device, a value of a breakdown voltage may be adjusted by adjusting a distance between a P-well (e.g., corresponding to 121) and an N-well (e.g., corresponding to 123); however, when the distance between the P-well and the N-well exceeds a specific value, after the ESD protection device is triggered, a current gain of the parasitic transistor Q2 may decrease. This may mean that the performance of the ESD protection device is reduced. However, as the ESD protection device 100 of the present disclosure is implemented such that diffusion regions (e.g., 132 and 135) surround other diffusion regions (e.g., 131 and 132), the N-well 123 surrounds the P-well 121, and diffusion regions (e.g., 136 and 137) surround other diffusion regions (e.g., 131, 132, 133, 134, and 135), a thyristor operation may be induced, and thus, a high current gain may be obtained. Accordingly, an ESD protection device that discharges an ESD voltage (or current) of a great value efficiently may be implemented.

Figure 4:
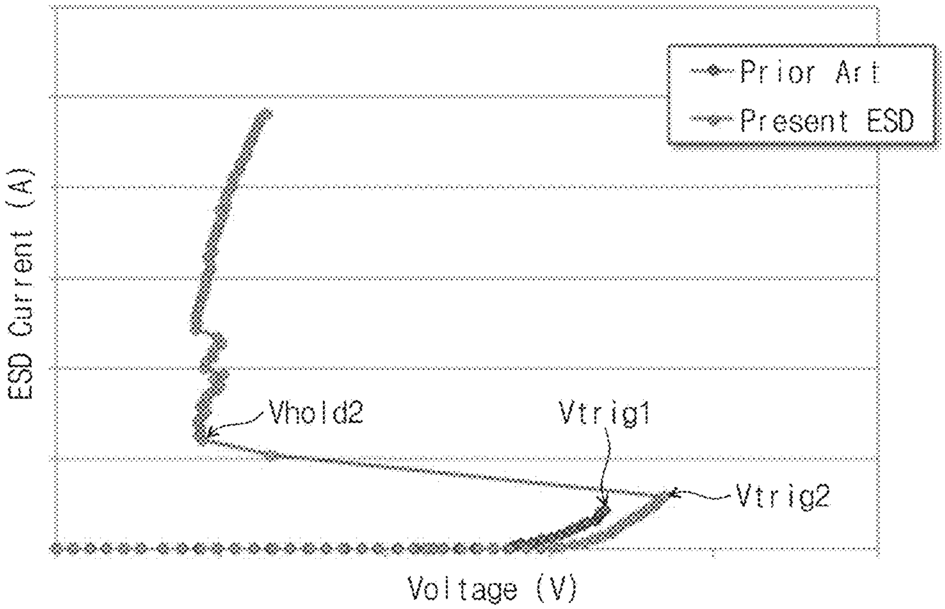
FIG. 4 is a graph illustrating an operating characteristic of an ESD protection device of the present disclosure.

FIG. 4 is a graph illustrating an operating characteristic of the ESD protection device 100 of the present disclosure.

Referring to FIG. 4, a trigger voltage of a conventional ESD protection device, in which the distance between the P-well and the N-well is extended to increase a breakdown voltage, may be "Vtrig1". In contrast, a trigger voltage of an ESD protection device of the present disclosure may be "Vtrig2", and a holding voltage thereof may be "Vhold2". Herein, the trigger voltage may mean a voltage immediately before a parasitic NPN transistor (e.g., Q2 and Q4 of FIG. 2) in the ESD protection device is turned on. The holding voltage may mean the lowest voltage in a negative resistance region (i.e., a snapback region) in which a voltage decreases because the parasitic NPN transistor fails to sustain a high voltage after operating.

Meanwhile, referring to the graph of the conventional ESD protection device, it is understood that the ESD protection device does not operate normally after triggered. The reason is that when the distance between the P-well and the N-well is extended to increase a value of a breakdown voltage that the ESD protection device is capable of enduring, the current gain decreases. That is, the ESD protection device does not operate normally.

In contrast, according to an ESD protection device of the present disclosure, it is confirmed from the graph of FIG. 4 that the ESD protection device is triggered at a relatively high voltage of Vtrig2, has the holding voltage of Vhold2 after the snapback region is formed, and has a time period where a value of the ESD current increases.

Figure 5:
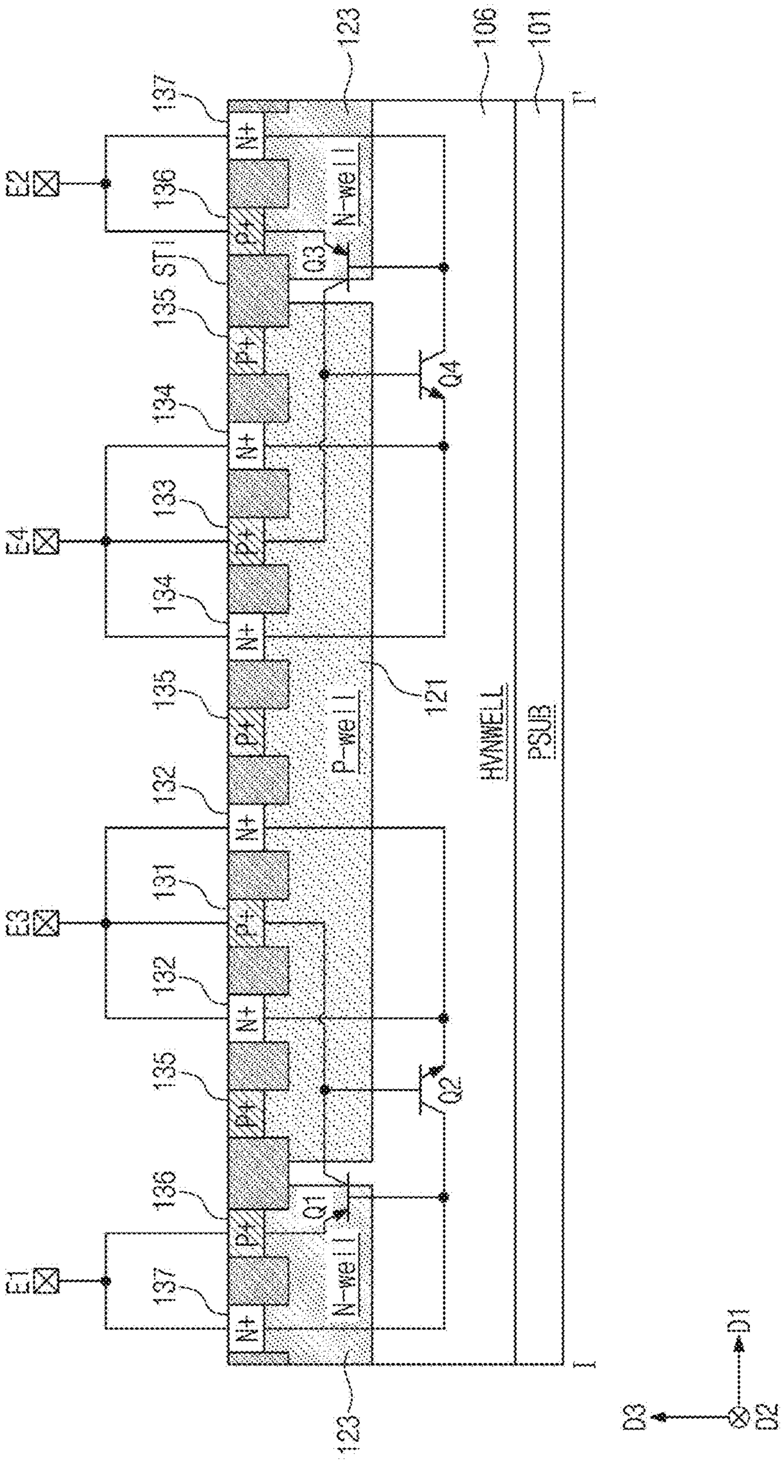
FIG. 5 illustrates a cross-sectional view of an ESD protection device taken along line I-I' of FIG. 1.

FIG. 5 illustrates a cross-sectional view of the ESD protection device 100 taken along line I-I' of FIG. 1.

The ESD protection device 100 of FIG. 5 may be mostly similar to the ESD protection device 100 of FIG. 2. However, the ESD protection device 100 may not include the resistors R1, R2, R3, and R4 illustrated in FIG. 2. For example, the ESD protection device 100 of FIG. 2 includes the resistors R1, R2, R3, and R4 for making the triggering of the thyristor easy by causing a voltage drop when an ESD current (or voltage) is introduced. However, in some cases, a resistance value sufficient to make the triggering of the thyristor easy may be implemented only with self-resistances of metal interconnections and/or vias for electrically connecting the electrodes E1, E2, E3, and E4 and the diffusion regions 131 to 137. In this case, the resistors R1, R2, R3, and R4 illustrated in FIG. 2 may not be required.

Figure 6:
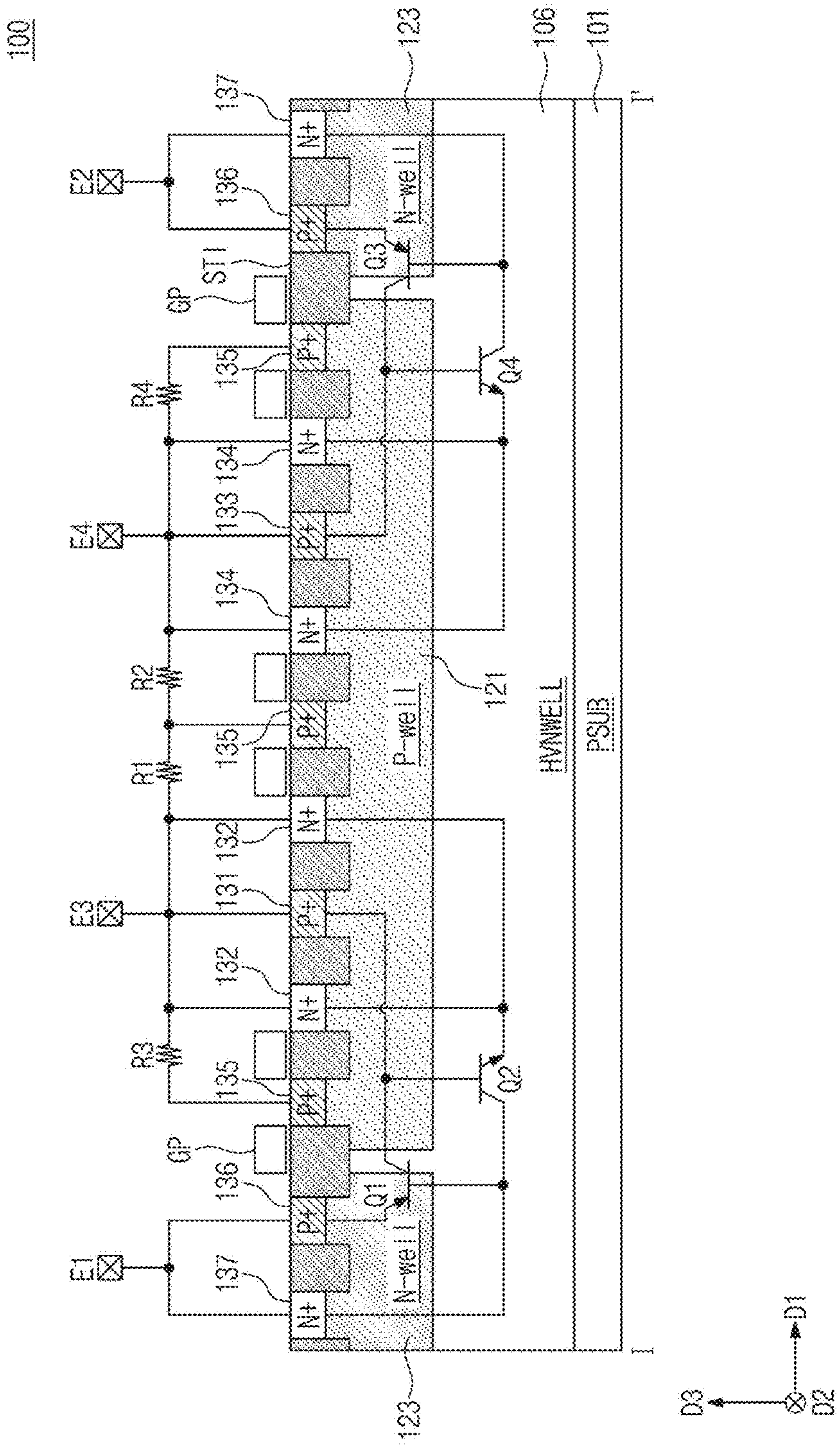
FIG. 6 illustrates a cross-sectional view of an ESD protection device taken along line I-I' of FIG. 1.

FIG. 6 illustrates a cross-sectional view of the ESD protection device 100 taken along line I-I' of FIG. 1.

The ESD protection device 100 of FIG. 6 may be mostly similar to the ESD protection device 100 of FIG. 2. However, the ESD protection device 100 of FIG. 6 may further include gate polysilicon patterns GP compared to the ESD protection device 100 of FIG. 2. The ESD protection device 100 may be manufactured through the CMOS process, and a gate electrode (i.e., the gate polysilicon pattern GP) may be formed in the process of manufacturing the ESD protection device 100. For example, the gate electrode may not be a gate electrode for forming a channel and may be formed on a device isolation layer such as STI. That is, the gate electrode illustrated in FIG. 6 may be a dummy gate electrode. For example, the gate polysilicon pattern GP may have a self-resistance and may cause a voltage drop when an ESD current (or voltage) is introduced.

Figure 7:
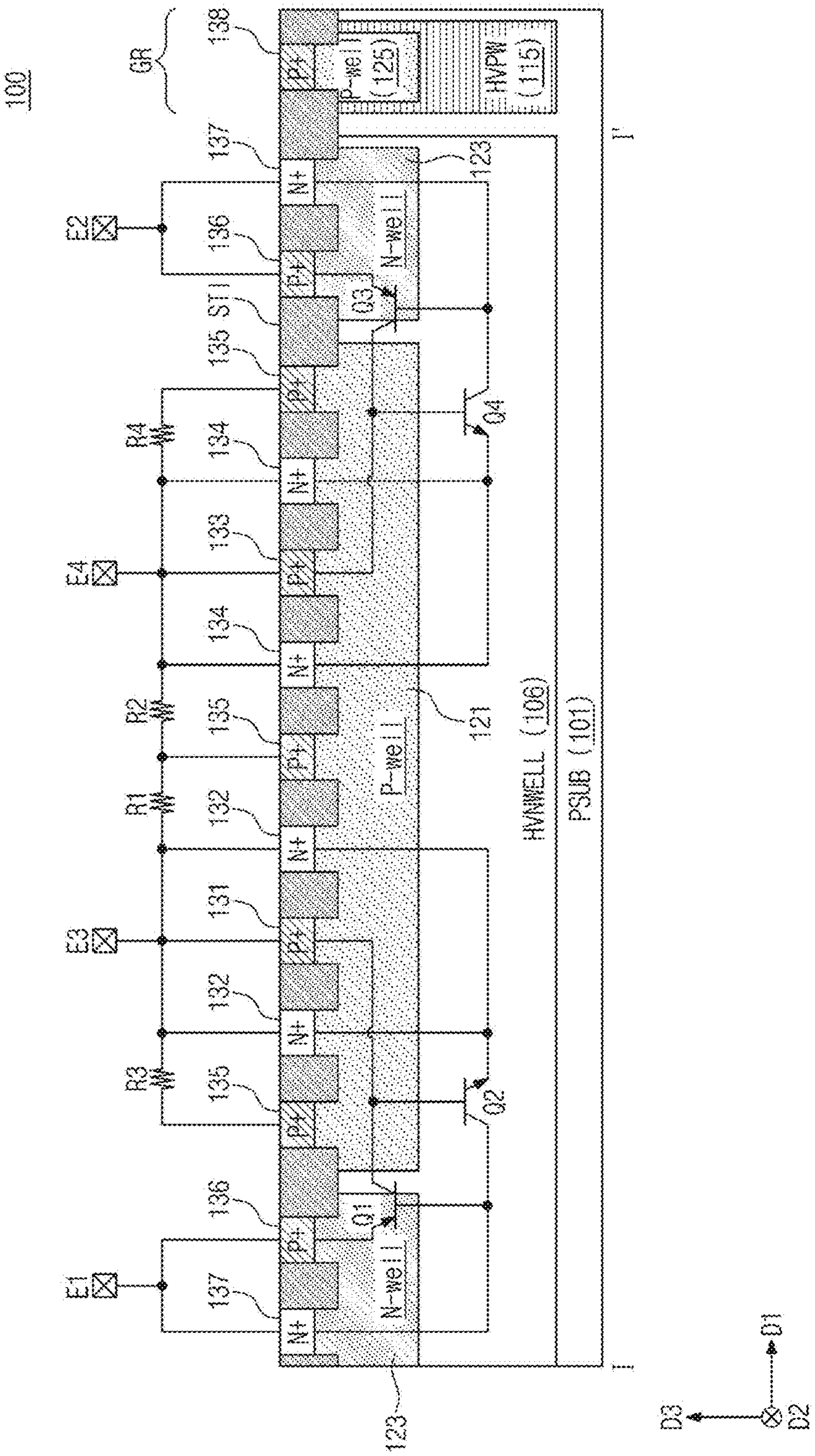
FIG. 7 illustrates a cross-sectional view of an ESD protection device taken along line I-I' of FIG. 1.

FIG. 7 illustrates a cross-sectional view of the ESD protection device 100 taken along line I-I' of FIG. 1.

The ESD protection device 100 of FIG. 7 may be mostly similar to the ESD protection device 100 of FIG. 2. Thus, additional description will be omitted to avoid redundancy. However, the ESD protection device 100 of FIG. 7 may further include a P-well 115, a P-well 125, and an eighth diffusion region 138. Although the P-well 115, the P-well 125, and the eighth diffusion region 138 are not illustrated in FIG. 2, it may be understood that the P-well 115, the P-well 125, and the eighth diffusion region 138 may be formed in a region outside the outermost shallow trench isolation STI.

The P-well 115 may be provided on the substrate 101, and the P-well 125 may be provided on the P-well 115. Herein, the dopant concentration of the P-well 115 may be lower than the dopant concentration of the P-well 125, and the P-well 115 may be a high-voltage P-well (HVPW). The eighth diffusion region 138 doped with P-type impurities may be provided on the P-well 125. In an embodiment, the P-well 115, the P-well 125, and the eighth diffusion region 138 may constitute a guard ring GR surrounding the ESD protection device 100. The guard ring GR may prevent a latch-up phenomenon in which the ESD current introduced to the ESD protection device 100 is discharged to the outside instead of to the third and fourth electrodes E3 and E4. Components associated with the guard ring GR illustrated in FIG. 7 may be applied to the embodiments of FIGS. 5 and 6.

Figure 8:
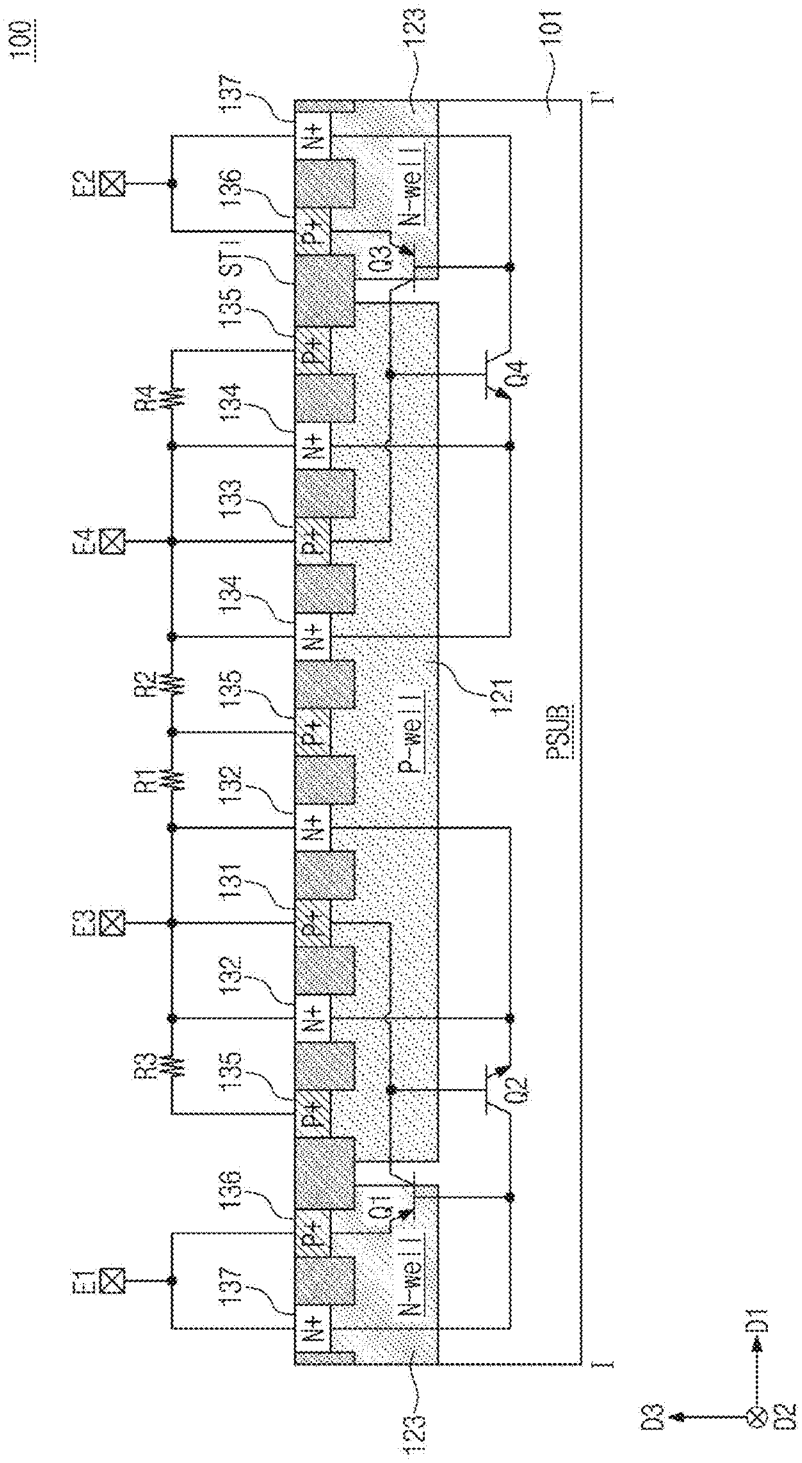
FIG. 8 illustrates a cross-sectional view of an ESD protection device taken along line I-I' of FIG. 1.
Figure 9:
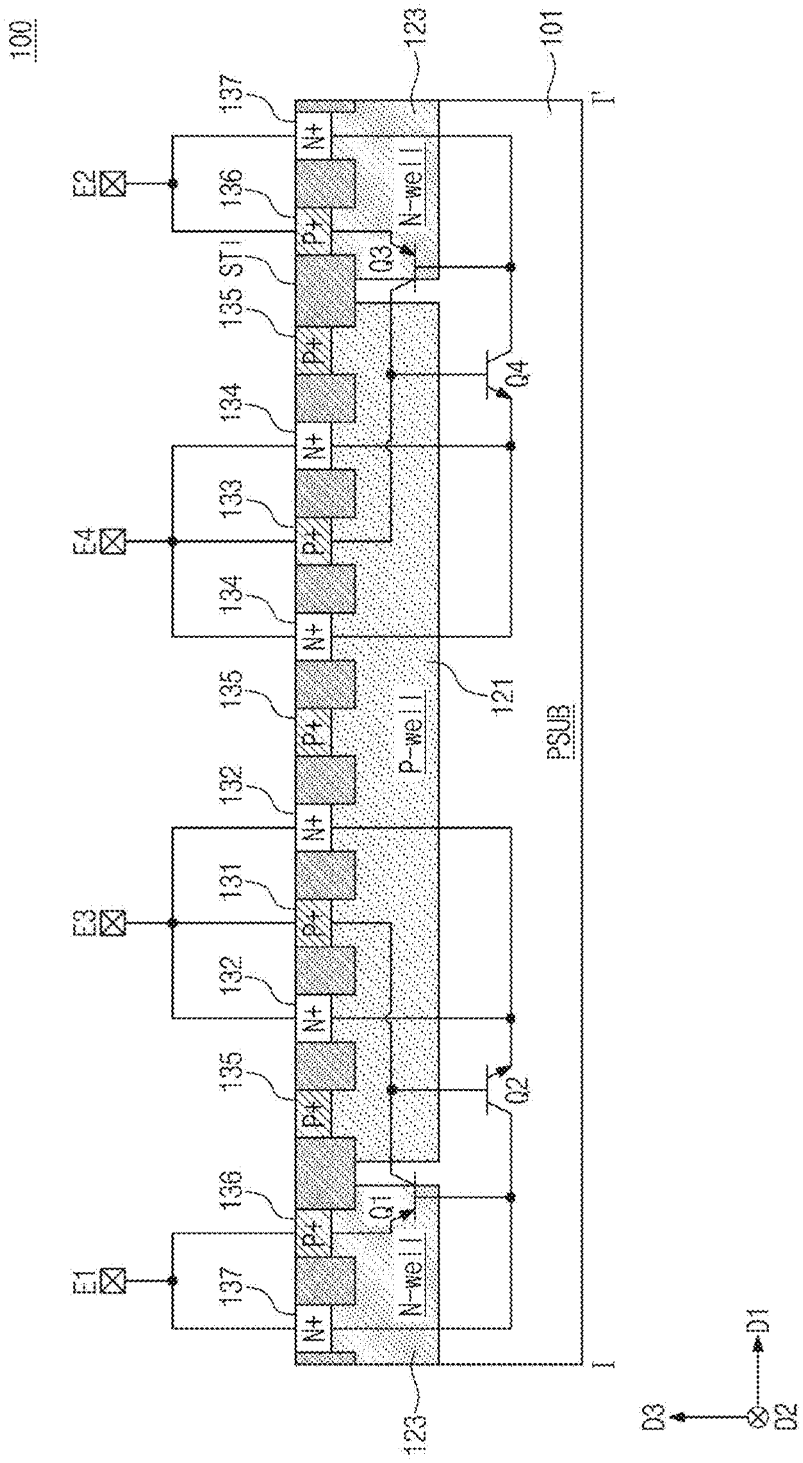
FIG. 9 illustrates a cross-sectional view of an ESD protection device taken along line I-I' of FIG. 1.
Figure 10:
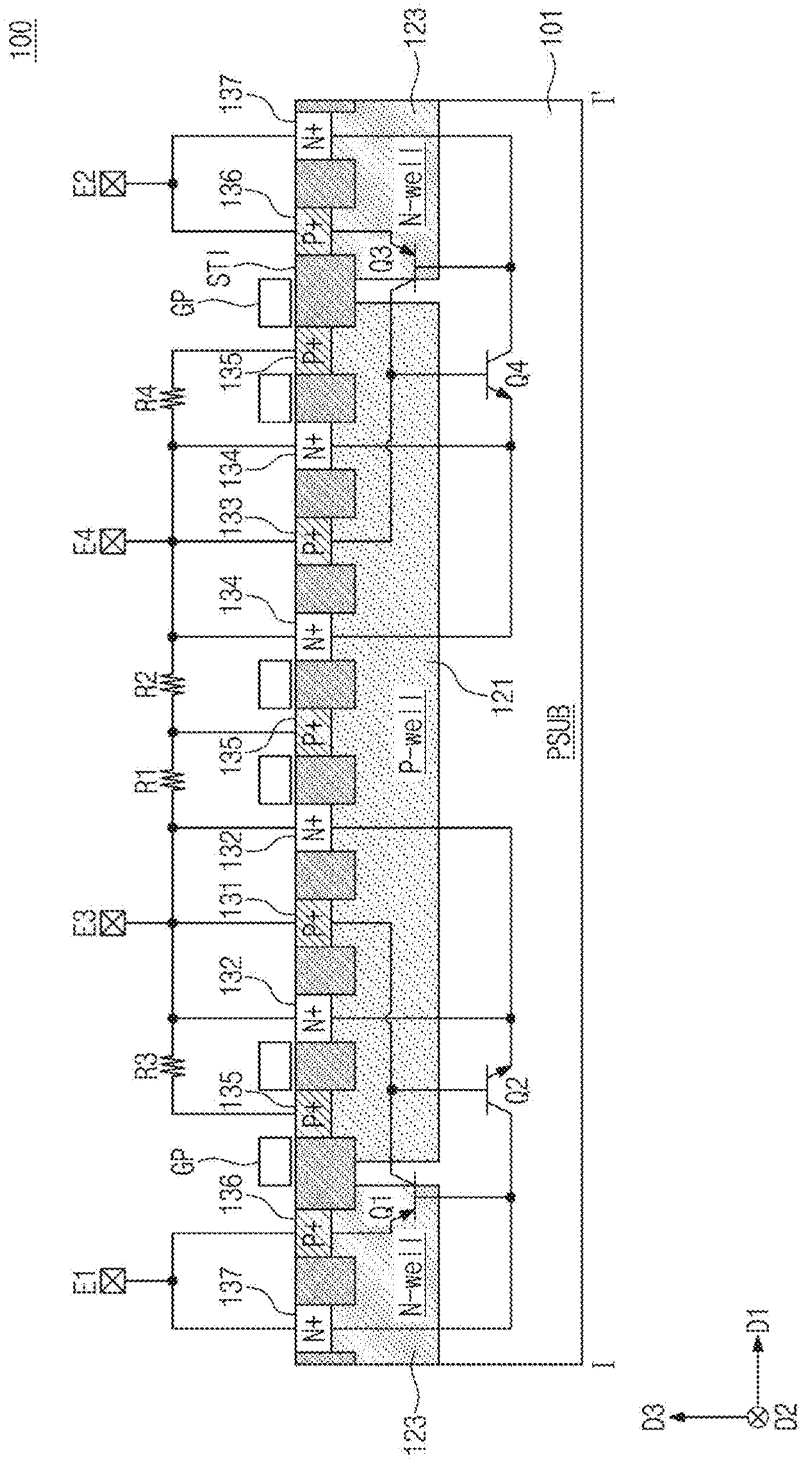
FIG. 10 illustrates a cross-sectional view of an ESD protection device taken along line I-I' of FIG. 1.

FIG. 8 illustrates a cross-sectional view of the ESD protection device 100 taken along line I-I' of FIG. 1. FIG. 9 illustrates a cross-sectional view of the ESD protection device 100 taken along line I-I' of FIG. 1. FIG. 10 illustrates a cross-sectional view of the ESD protection device 100 taken along line I-I' of FIG. 1. The ESD protection devices 100 of FIGS. 8 to 10 may be mostly similar to the ESD protection devices 100 of FIGS. 2 and 4. However, the ESD protection devices 100 of FIGS. 8 to 10 are similar to the ESD protection devices 100 of FIGS. 2, 5, and 6 respectively, except that the P-well 121 and the N-well 123 are formed on the substrate 101 without including the N-well 106, and thus, additional description will be omitted to avoid redundancy.

Figure 11:
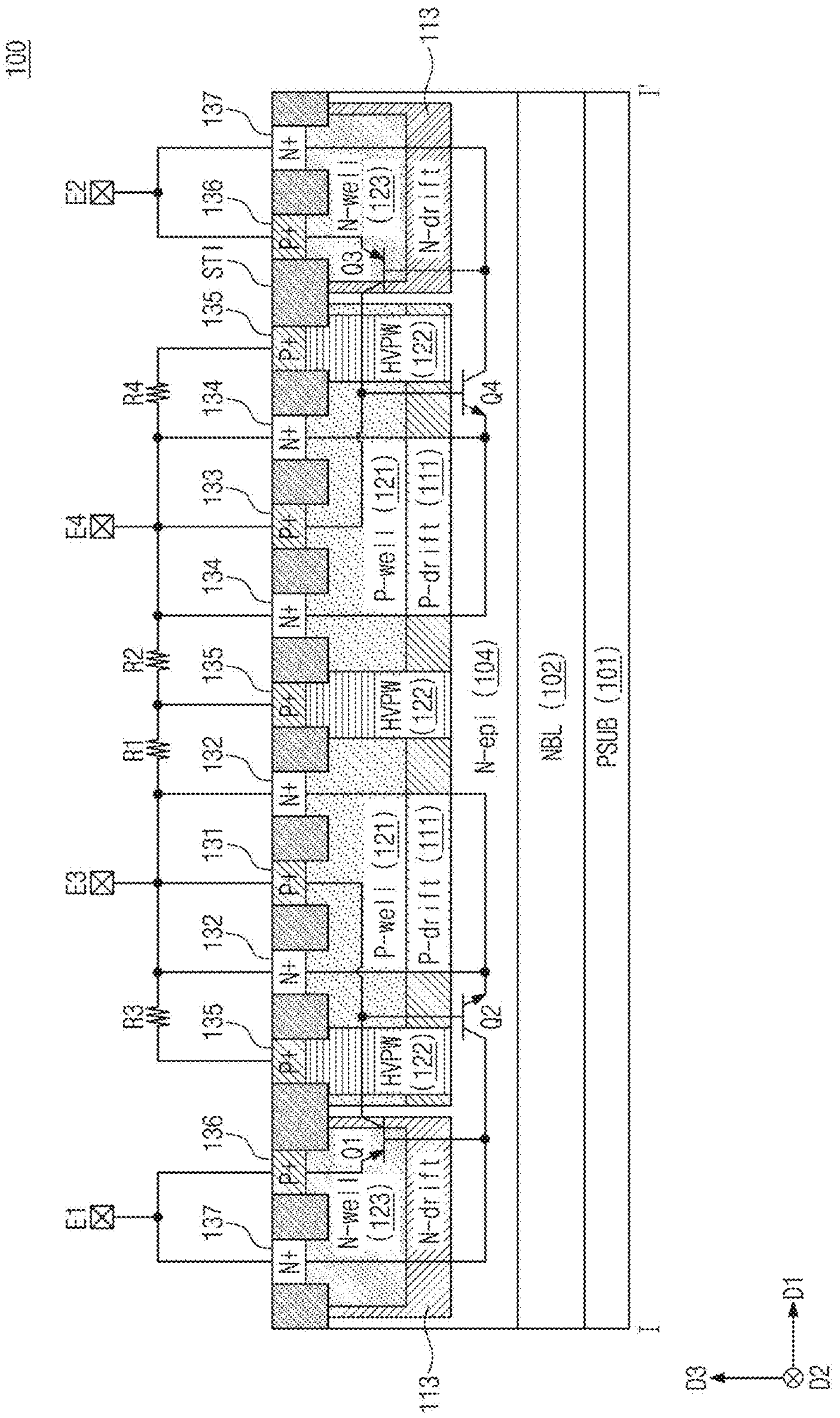
FIG. 11 illustrates a cross-sectional view of an ESD protection device taken along line I-I' of FIG. 1.

FIG. 11 illustrates a cross-sectional view of the ESD protection device 100 taken along line I-I' of FIG. 1.

Referring to FIGS. 1 and 11, the ESD protection device 100 may include the substrate 101, a buried layer 102, an epitaxial layer 104, a P-type drift region 111, an N-type drift region 113, the P-well 121, a P-well 122, the N-well 123, and the diffusion regions 131 to 137.

The substrate 101 may be a semiconductor substrate such as a semiconductor wafer. The epitaxial layer 104 may be formed on the substrate 101. The epitaxial layer 104 may be formed on the substrate 101 through selective epitaxial growth or solid phase epitaxial growth. Although the substrate 101 and the epitaxial layer 104 are illustrated in FIG. 11 as independent components, the epitaxial layer 104 may be understood as being as a portion of the substrate 101. The substrate 101 may have a low dopant concentration of P-type conductivity, and the epitaxial layer 104 may have a low dopant concentration of N-type conductivity. For example, the dopant concentration of the epitaxial layer 104 may be lower than the dopant concentration of any other doped region, but the present invention is not limited thereto.

The buried layer 102 may be formed between the epitaxial layer 104 and the substrate 101. The buried layer 102 may be formed by injecting N-type impurities (i.e., dopant) of a low dopant concentration between the substrate 101 and the epitaxial layer 104. For example, the dopant concentration of the buried layer 102 may be higher than the dopant concentration of any other doped region, but the present invention is not limited thereto.

The P-well 121 and the N-well 123 may be formed on the epitaxial layer 104. For example, the N-well 123 may be formed on the epitaxial layer 104 to surround the P-well 121 in a plan view. The P-type drift region 111 may be formed on a lower portion of the P-well 121, and the N-type drift region 113 may be formed on a lower portion of the N-well 123. For example, the N-type drift region 113 may be formed on the epitaxial layer 104 to surround the P-type drift region 111 in a plan view. For example, the level (i.e., height) from the substrate 101, at which the N-type drift region 113 is formed may be mostly (or substantially) the same as the level (i.e., height) from the substrate 101, at which the P-type drift region 111 is formed. The P-well 121 and the N-well 123 may be doped with impurities of a relatively high concentration, and the P-type drift region 111 and the N-type drift region 113 may be doped with impurities of a concentration lower than the concentration of the P-well 121 and the N-well 123.

The P-well 122 may be formed in the P-well 121 and the P-type drift region 111. The P-well 122 may be formed to be similar in shape to the fifth diffusion region 135 illustrated in FIG. 1 in a plan view. For example, the doping concentration of the P-well 122 may be lower than the doping concentration of the P-well 121 and the P-type drift region 111. The P-well 122 may be a deep-well in that the P-well 122 is formed to be deeper than the P-well 121.

The first diffusion region 131 may be formed on the P-well 121, and the second diffusion region 132 may be formed on the P-well 121 to surround the first diffusion region 131 in a plan view. The third diffusion region 133 may be formed on the P-well 121, and the fourth diffusion region 134 may be formed on the P-well 121 to surround the third diffusion region 133 in a plan view. The first diffusion region 131 and the third diffusion region 133 may be doped with P-type impurities of a higher concentration than the P-well 121, and the second diffusion region 132 and the fourth diffusion region 134 may be doped with N-type impurities of a higher concentration than the P-well 121.

The fifth diffusion region 135 may be formed on the P-well 122. The fifth diffusion region 135 may be formed on the P-well 122 to surround the second diffusion region 132 and the fourth diffusion region 134 in a plan view. The fifth diffusion region 135 may be doped with P-type impurities of a higher concentration than the P-well 121 and the P-well 122.

The sixth diffusion region 136 and the seventh diffusion region 137 may be formed on the N-well 123. The sixth diffusion region 136 may be formed on the N-well 123 to surround the fifth diffusion region 135 in a plan view, and the seventh diffusion region 137 may be formed on the N-well 123 to surround the sixth diffusion region 136 in a plan view. The sixth diffusion region 136 may be doped with P-type impurities of a higher concentration than the N-well 123, and the seventh diffusion region 137 may be doped with N-type impurities of a higher concentration than the N-well 123.

Referring to an equivalent circuit diagram illustrated in FIG. 11, the sixth diffusion region 136 connected to the first electrode E1, the N-well 123, and the P-well 121 may constitute the PNP transistor Q1. The N-well 123 connected to the first electrode E1 through the diffusion regions 136 and 137, the P-well 121, and the second diffusion region 132 may constitute the NPN transistor Q2. As in the above description, the sixth diffusion region 136 connected to the second electrode E2, the N-well 123, and the P-well 121 may constitute the PNP transistor Q3, and the N-well 123 connected to the second electrode E2 through the diffusion regions 136 and 137, the P-well 121, and the fourth diffusion region 134 may constitute the NPN transistor Q4.

In detail, the N-well 123, the sixth diffusion region 136 connected to the first electrode E1, and the P-well 121 may respectively form a base, an emitter, and a collector of the PNP transistor Q1, and the P-well 121, the second diffusion region 132, and the N-well 123 may respectively form a base, an emitter, and a collector of the NPN transistor Q2. As in the above description, the N-well 123, the sixth diffusion region 136 connected to the second electrode E2, and the P-well 121 may respectively form a base, an emitter, and a collector of the PNP transistor Q3, and the P-well 121, the fourth diffusion region 134, and the N-well 123 may respectively form a base, an emitter, and a collector of the NPN transistor Q4.

The ESD protection device 100 operates based on a first thyristor composed of the transistors Q1 and Q2 and a second thyristor composed of the transistors Q3 and Q4. In particular, the P-type drift region 111, the N-type drift region 113, the P-well 121, the P-well 122, and the diffusion regions 131 to 137 constituting the thyristors performing the electrostatic discharge function may be referred to as "one cell". The detailed operation of the ESD protection device 100 is the same as the operation of the ESD protection device 100 illustrated in FIG. 3, and thus, additional description will be omitted to avoid redundancy.

In an embodiment, the bases and the emitters of the transistors Q1, Q2, Q3, and Q4 of the ESD protection device 100 of FIG. 11 are formed in upper layers of the buried layer 102. In this case, even though the first thyristor composed of the transistors Q1 and Q2 and the second thyristor composed of the transistors Q3 and Q4 are connected in series to thyristors of another cell adjacent thereto, the buried layer 102 may not be shared. That is, the capacity of the ESD current capable of being discharged by electrically connecting the cell of FIG. 11 and a cell adjacent thereto may increase. This will be described in detail with reference to FIGS. 15 and 16.

Figure 12:
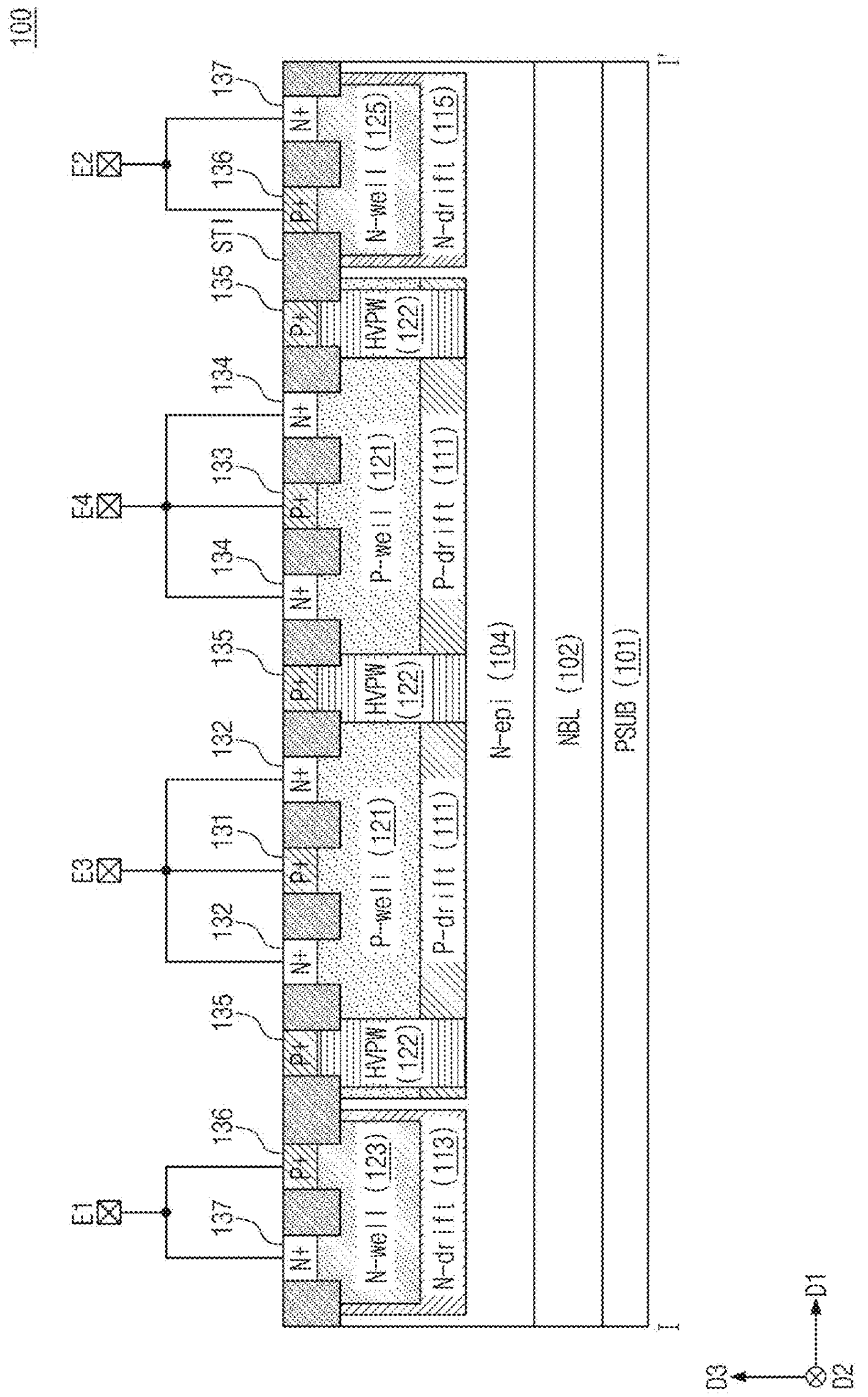
FIG. 12 illustrates a cross-sectional view of an ESD protection device taken along line I-I' of FIG. 1.

FIG. 12 illustrates a cross-sectional view of the ESD protection device 100 taken along line I-I' of FIG. 1.

The ESD protection device 100 of FIG. 12 may be mostly similar to the ESD protection device 100 of FIG. 11. However, the ESD protection device 100 of FIG. 12 may not include resistors (i.e., R1, R2, R3, and R4 of FIG. 11) for making the triggering of the thyristor easy when an ESD current (or voltage) is introduced. For example, in an embodiment, a resistance value sufficient to make the triggering of the thyristor easy may be implemented only with self-resistances of metal interconnections and/or vias for electrically connecting the electrodes E1, E2, E3, and E4 and the diffusion regions 131 to 137, and thus, the resistors illustrated in FIG. 11 may not be required.

Figure 13:
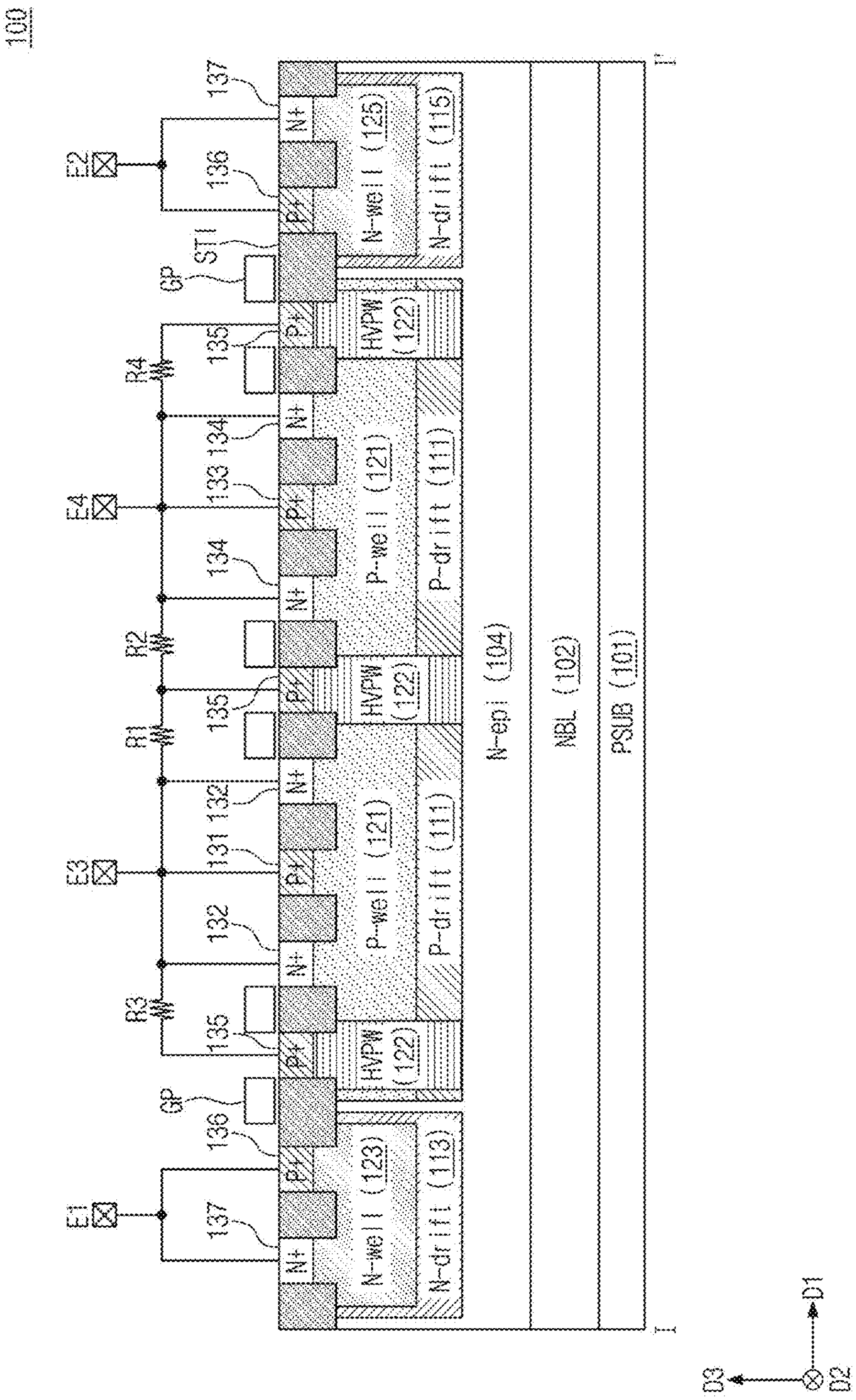
FIG. 13 illustrates a cross-sectional view of an ESD protection device taken along line I-I' of FIG. 1.

FIG. 13 illustrates a cross-sectional view of the ESD protection device 100 taken along line I-I' of FIG. 1.

The ESD protection device 100 of FIG. 13 may be mostly similar to the ESD protection device 100 of FIG. 11 and may further include the gate polysilicon patterns GP compared to the ESD protection device 100 of FIG. 11. The ESD protection device 100 may be manufactured through the CMOS process, and a dummy gate electrode (i.e., the gate polysilicon pattern GP) may be formed in the process of manufacturing the ESD protection device 100. That is, the dummy gate electrode GP may not be a gate electrode for forming a channel of a transistor (i.e., a field effect transistor (FET)) and may be formed on a device isolation layer such as STI. The dummy gate electrode GP may have a self-resistance and may cause a voltage drop when an ESD current (or voltage) is introduced.

Figure 14:
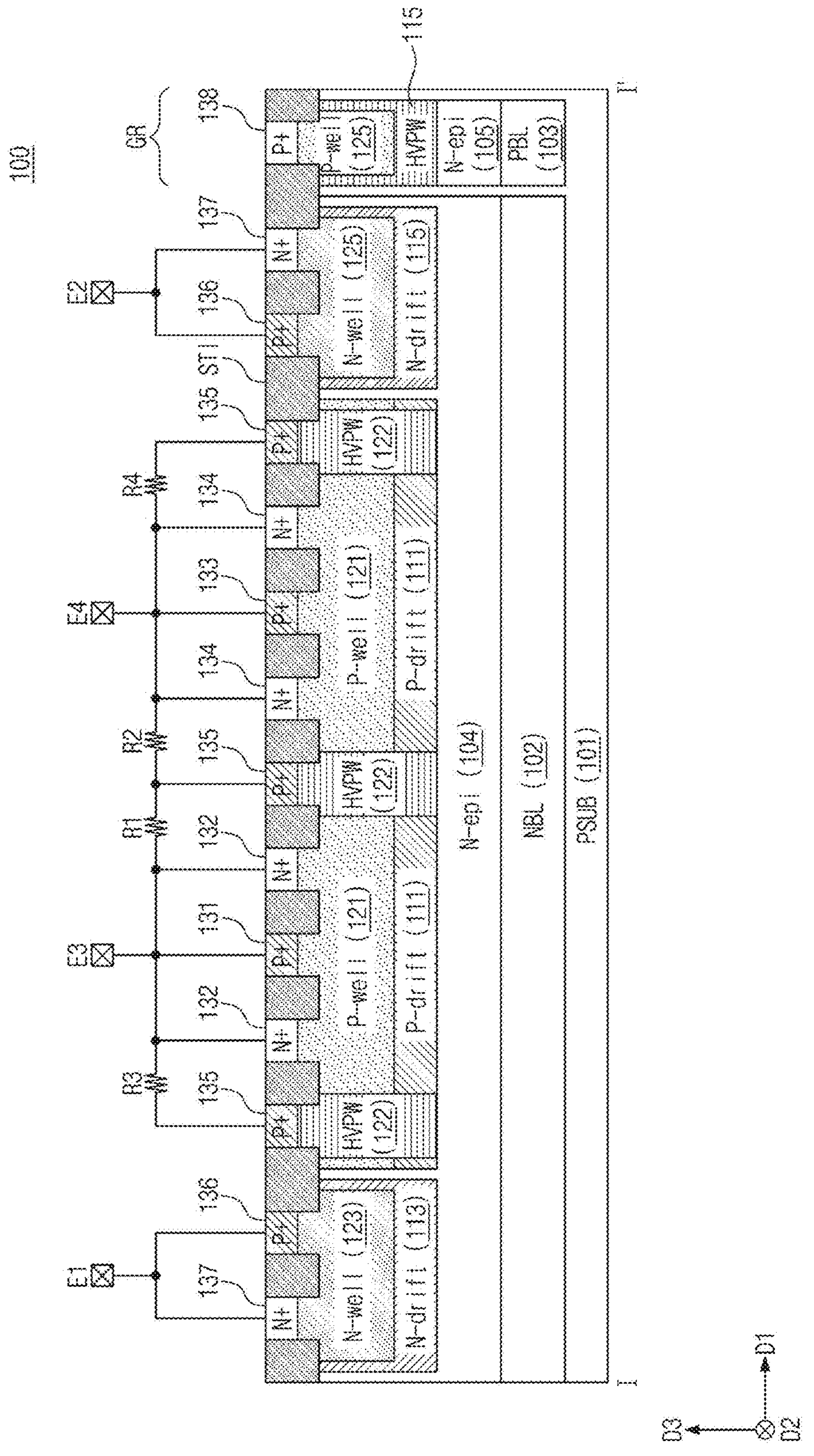
FIG. 14 illustrates a cross-sectional view of an ESD protection device taken along line I-I' of FIG. 1.

FIG. 14 illustrates a cross-sectional view of the ESD protection device 100 taken along line I-I' of FIG. 1.

The ESD protection device 100 of FIG. 14 may be mostly similar to the ESD protection device 100 of FIG. 11. Thus, additional description will be omitted to avoid redundancy. However, the ESD protection device 100 of FIG. 14 may further include a buried layer 103, an epitaxial layer 105, the P-well 115, the P-well 125, and the eighth diffusion region 138. Although the above components are not illustrated in FIG. 1, this may be understood as being formed in a region outside the outermost shallow trench isolation STI of FIG. 1.

The epitaxial layer 105 may be formed on the substrate 101, and the buried layer 103 doped with P-type impurities of a high concentration may be formed between the substrate 101 and the epitaxial layer 105. The epitaxial layer 105 may have a low-concentration N-type conductivity. In an embodiment, the buried layer 103, the epitaxial layer 105, the P-well 115, the P-well 125, and the eighth diffusion region 138 may constitute the guard ring GR, and the guard ring GR may prevent a latch-up phenomenon in which the ESD current introduced to the ESD protection device 100 is discharged to the outside. Components associated with the guard ring GR illustrated in FIG. 14 may be applied to the embodiments of FIGS. 12 and 13.

Figure 15:
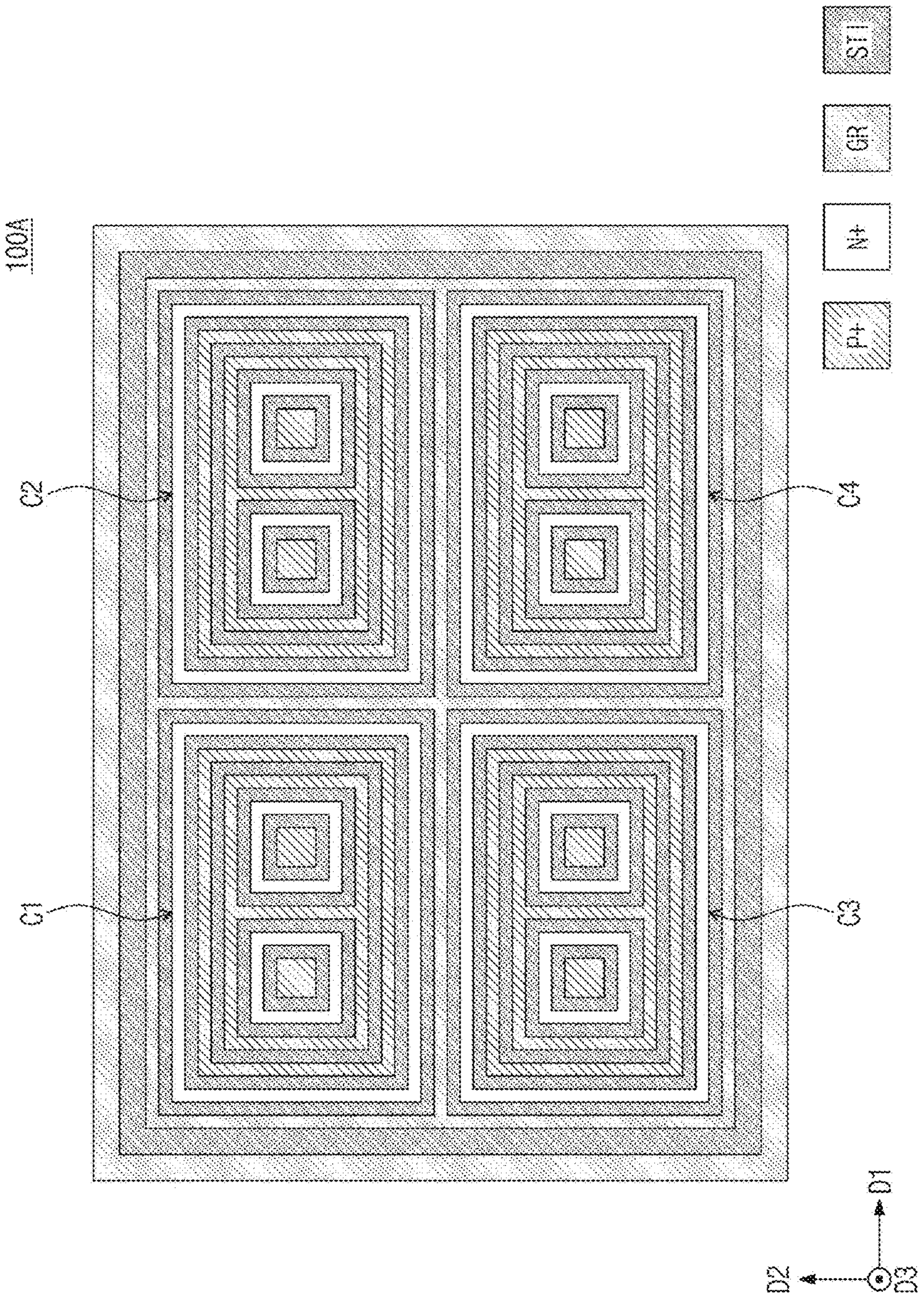
FIG. 15 is a plan view of an ESD protection device including a plurality of cells according to an embodiment of the present disclosure.

FIG. 15 is a plan view of an ESD protection device 100A including a plurality of cells according to an embodiment of the present disclosure.

The ESD protection device 100A may include a plurality of cells C1, C2, C3, and C4. For example, each of the plurality of cells C1, C2, C3, and C4 may be any one of the cells described with reference to the above embodiments.

In an embodiment, the plurality of cells C1, C2, C3, and C4 may be arranged along the first direction D1 and the second direction D2. The plurality of cells C1, C2, C3, and C4 may be distinguished from each other by the guard ring GR in a plan view, and the guard ring GR may surround each of the plurality of cells C1, C2, C3, and C4 in a plan view. For example, the guard ring GR may extend around an outer periphery of the plurality of cells C1, C2, C3, and C4 and may extend between adjacent ones of the plurality of cells C1, C2, C3, and C4. The guard ring GR may prevent the ESD current (or voltage) introduced to the plurality of cells C1, C2, C3, and C4 from flowing to the outside.

Figure 16:
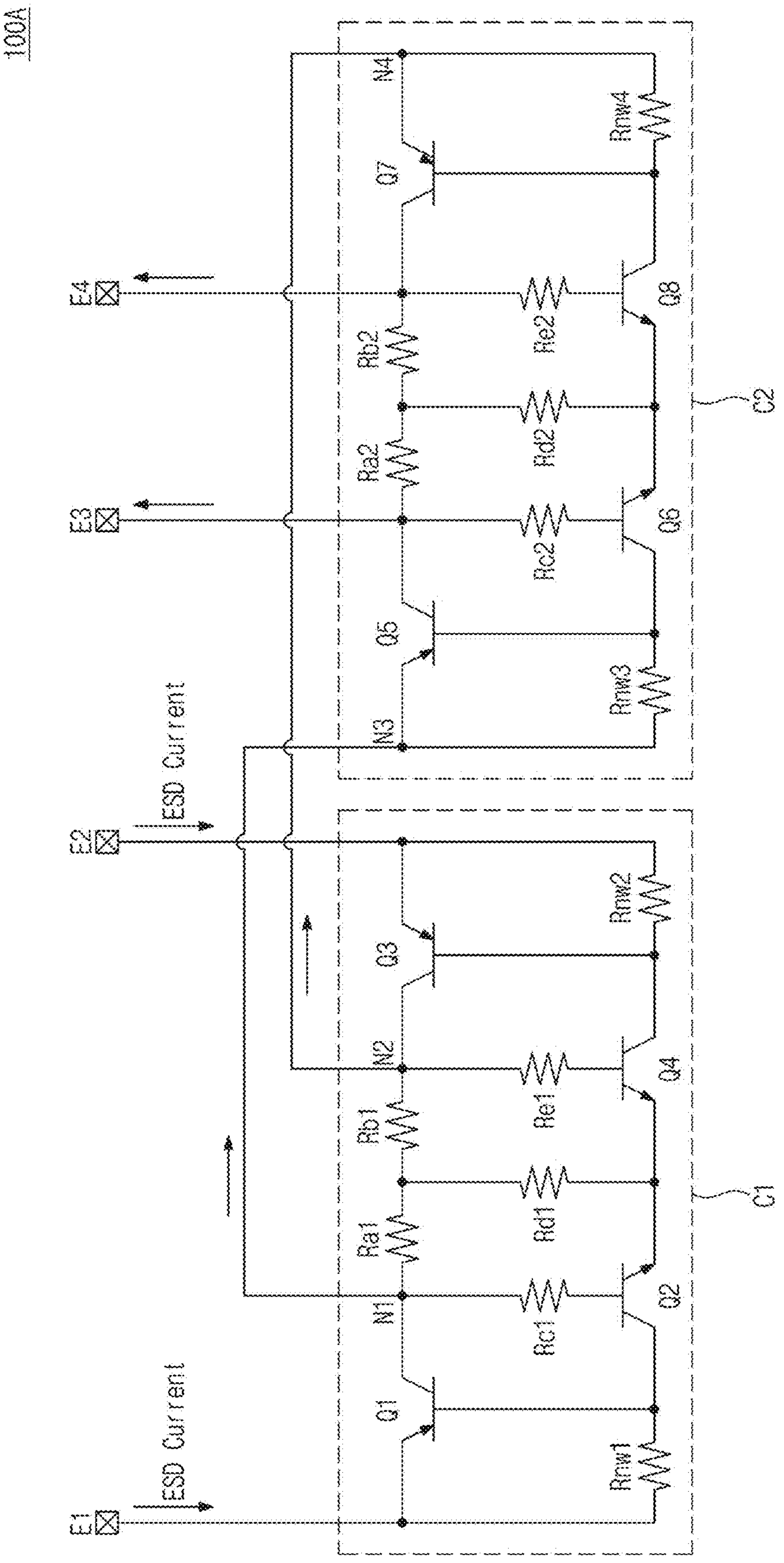
FIG. 16 is a circuit diagram of cells of an ESD protection device illustrated in FIG. 15.

FIG. 16 is a circuit diagram of the cells C1 and C2 of an ESD protection device illustrated in FIG. 15.

The ESD protection device 100A may include the first cell C1 and the second cell C2. The first cell C1 may include the transistors Q1 and Q2 constituting a first thyristor and the transistors Q3 and Q4 constituting a second thyristor. The first cell C1 may include resistors Ra1, Rb1, Rc1, Rd1, Re1, Rnw1, and Rnw2. The second cell C2 may include transistors Q5 and Q6 constituting a third thyristor and transistors Q7 and Q8 constituting a fourth thyristor. The second cell C2 may include resistors Ra2, Rb2, Rc2, Rd2, Re2, Rnw3, and Rnw4. However, the resistors Ra1, Rb1, Rc1, Rd1, Re1, Rnw1, and Rnw2 of the first cell C1 and the resistors Ra2, Rb2, Rc2, Rd2, Re2, Rnw3, and Rnw4 of the second cell C2 are simply models and are provided as an example, and a detailed placement and a detailed connection relationship of resistors are not limited to the example illustrated in FIG. 16.

The first cell C1 may include the first electrode E1 and the second electrode E2. The first electrode E1 and the second electrode E2 may be an anode electrode receiving the ESD current (or voltage). The second cell C2 may include the third electrode E3 and the fourth electrode E4. The third electrode E3 and the fourth electrode E4 may be a cathode electrode connected to a ground node. A first node N1 of the first cell C1 may be connected to a third node N3 of the second cell C2, and a second node N2 of the first cell C1 may be connected to a fourth node N4 of the second cell C2.

The ESD current input to the first electrode E1 and the second electrode E2 may be transferred to the third node N3 and the fourth node N4 through the first node N1 and the second node N2. The ESD current input to the third node N3 and the fourth node N4 may flow to a ground electrode through the third electrode E3 and the fourth electrode E4.

According to the above configuration, as two or more cells are connected in series, the amount of ESD current (or voltage) that the ESD protection device 100A discharges may increase. Accordingly, the ESD current of a high level may be efficiently discharged. This may mean that the performance of the ESD protection device 100A is improved.

Figure 17:
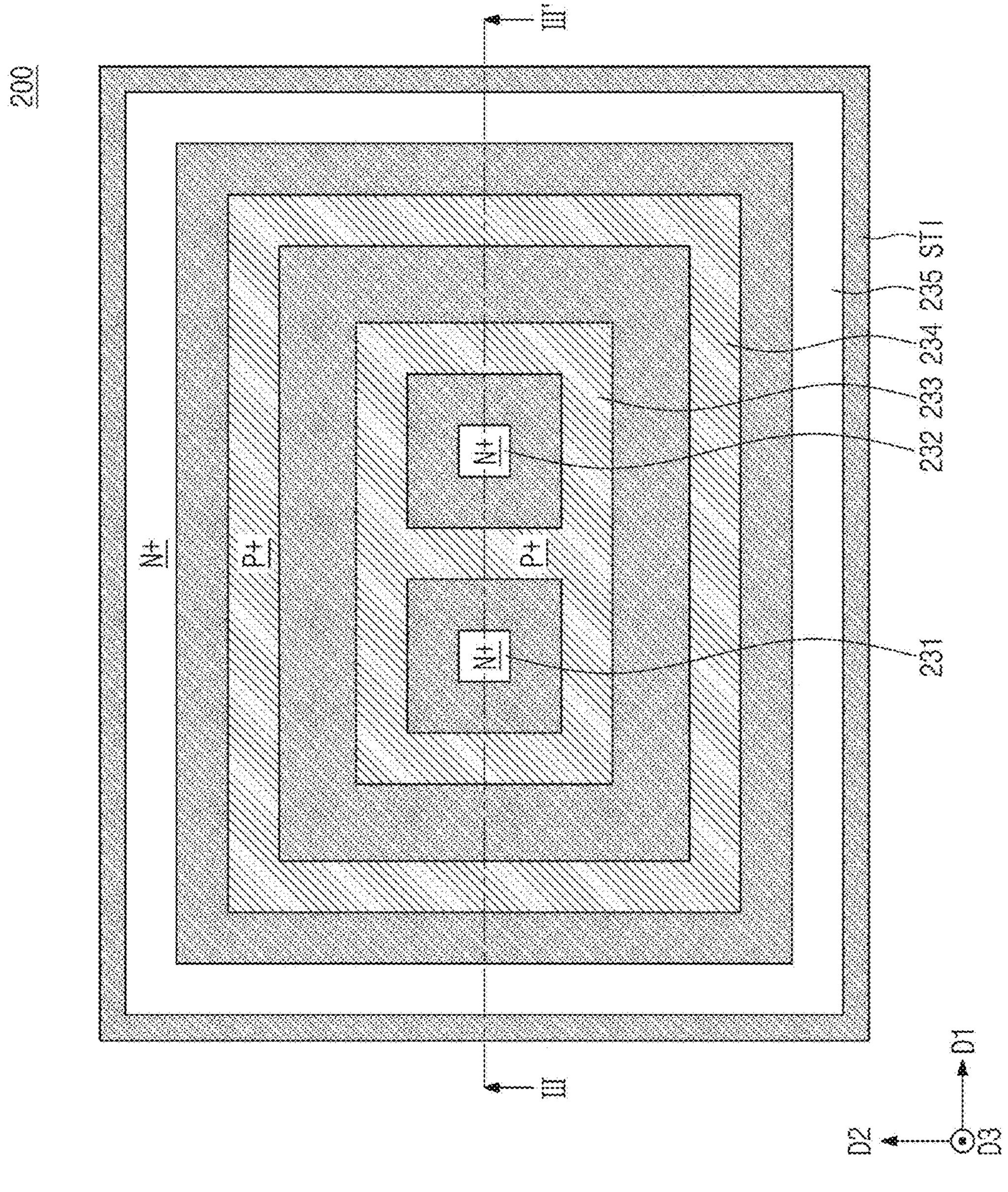
FIG. 17 illustrates a plan view of an ESD protection device according to an embodiment of the present disclosure.
Figure 18:
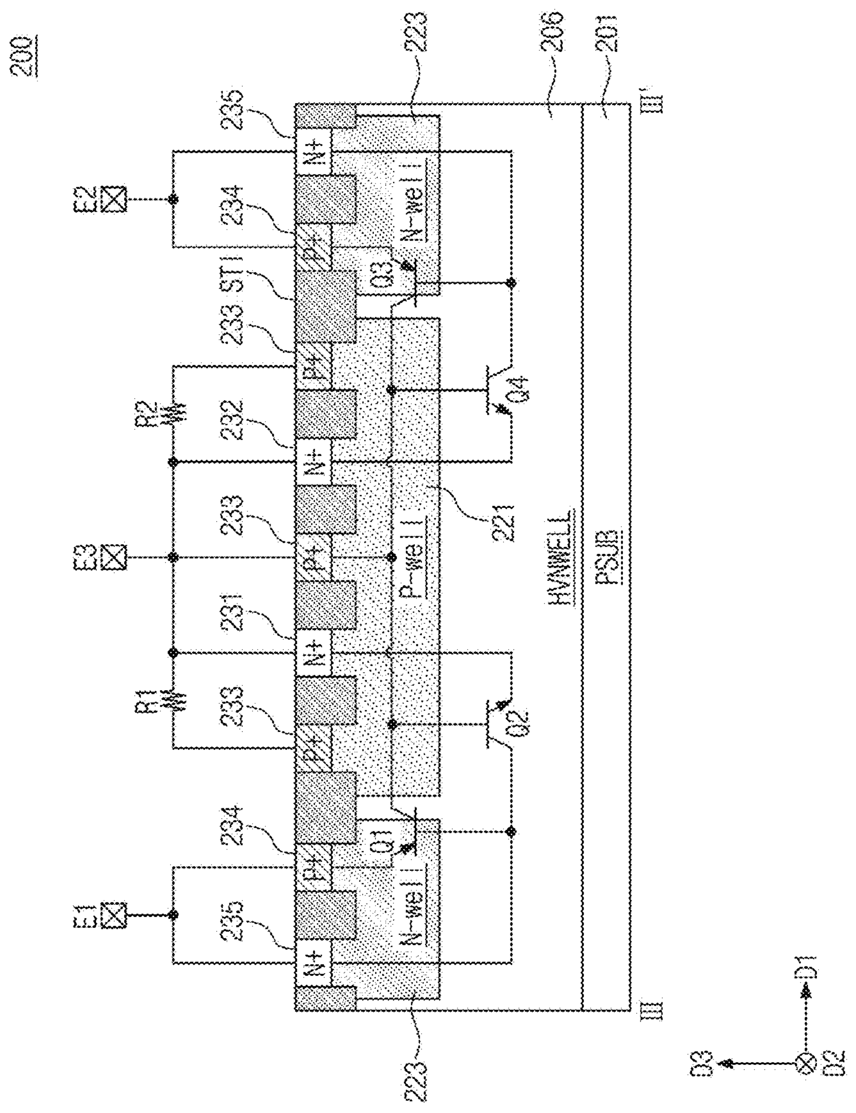
FIG. 18 illustrates a cross-sectional view of an ESD protection device taken along line III-III' of FIG. 17.

FIG. 17 illustrates a plan view of an ESD protection device 200 according to an embodiment of the present disclosure. FIG. 18 illustrates a cross-sectional view of an ESD protection device 200 taken along line III-III' of FIG. 17.

Referring to FIGS. 17 and 18, the ESD protection device 200 may include a substrate 201, an N-well (HVNWELL) 206, a P-well 221, an N-well 223, a first diffusion region 231, a second diffusion region 232, a third diffusion region 233, a fourth diffusion region 234, and a fifth diffusion region 235.

The substrate 201 may be a bulk silicon substrate, a silicon-on-insulator substrate, a germanium substrate, a germanium-on-insulator substrate, or a silicon-germanium substrate. The substrate 201 may have a single crystal structure. The substrate 201 may be doped with P-type impurities (i.e., dopant) of a low concentration.

The N-well 206 whose doping concentration is higher than that of the substrate 201 may be formed on the substrate 201. The N-well 106 may be a high-voltage N-well. The P-well 221 may be formed on the N-well 206, and the N-well 223 may be formed on the N-well 206 to surround the P-well 221. The P-well 221 may be doped with P-type impurities of a higher doping concentration than the N-well 206, and the N-well 223 may be doped with N-type impurities of a higher doping concentration than the N-well 206.

The first diffusion region 231 and the second diffusion region 232 may be formed on the P-well 221, and the first diffusion region 231 and the second diffusion region 232 may be spaced from each other in the first direction D1. The third diffusion region 233 may be formed on the P-well 221, and the third diffusion region 233 may surround the first diffusion region 231 and the second diffusion region 232 in a plan view. The fourth diffusion region 234 and the fifth diffusion region 235 may be formed on the N-well 223. The fourth diffusion region 234 may surround the third diffusion region 233 in a plan view, and the fifth diffusion region 235 may surround the fourth diffusion region 234 in a plan view.

The first diffusion region 231, the second diffusion region 232, and the fifth diffusion region 235 may be doped with N-type impurities, and the third diffusion region 233 and the fourth diffusion region 234 may be doped with P-type impurities. The doping concentration of the first diffusion region 231 to the third diffusion region 233 may be higher than the doping concentration of the P-well 221. The doping concentration of the fourth diffusion region 234 and the fifth diffusion region 235 may be higher than the doping concentration of the N-well 223.

The first diffusion region 231 to the fifth diffusion region 235 may be electrically isolated (or separated) from each other by a device isolation layer (e.g., an STI).

The fourth diffusion region 234 and the fifth diffusion region 235 may be electrically connected to each other, for example, through a metal interconnection and/or a via, and the first diffusion region 231 to the third diffusion region 233 may be electrically connected to each other, for example, through a metal interconnection and/or a via. The fourth diffusion region 234 and the fifth diffusion region 235 may be connected to a first electrode E1 and a second electrode E2, and the first diffusion region 231 to the third diffusion region 233 may be connected to a third electrode E3. The first electrode E1 and the second electrode E2 may be an anode electrode receiving an ESD current (or voltage), and the third electrode E3 may be a cathode electrode connected to a ground node.

In an embodiment, a first resistor R1 may be connected between the first diffusion region 231 and the third diffusion region 233, and a second resistor R2 may be connected between the second diffusion region 232 and the third diffusion region 233. The resistors R1 and R2 may cause a voltage drop when the ESD current (or voltage) is introduced, thus making the triggering of the thyristor easy.

Referring to an equivalent circuit diagram illustrated in FIG. 18, the fourth diffusion region 234 connected to the first electrode E1, the N-well 223, and the P-well 221 may constitute a PNP transistor Q1. The N-well 223 connected to the first electrode E1 through the diffusion regions 234 and 235, the P-well 221, and the first diffusion region 231 may constitute an NPN transistor Q2. The fourth diffusion region 234 connected to the second electrode E2, the N-well 223, and the P-well 221 may constitute a PNP transistor Q3, and the N-well 223 connected to the second electrode E2 through the diffusion regions 234 and 235, the P-well 221, and the first diffusion region 231 may constitute an NPN transistor Q4.

In detail, the N-well 223, the fourth diffusion region 234 connected to the first electrode E1, and the P-well 221 may respectively form a base, an emitter, and a collector of the PNP transistor Q1, and the P-well 221, the first diffusion region 231, and the N-well 223 may respectively form a base, an emitter, and a collector of the NPN transistor Q2. As in the above description, the N-well 223, the fourth diffusion region 234 connected to the second electrode E2, and the P-well 221 may respectively form a base, an emitter, and a collector of a PNP transistor Q3, and the P-well 221, the second diffusion region 232, and the N-well 223 may respectively form a base, an emitter, and a collector of an NPN transistor Q4.

The ESD protection device 200 of FIG. 18 is different in structure from those of the above embodiments. However, the ESD protection device 200 is substantially the same as the ESD protection devices 100 described with reference to FIGS. 1 to 14 in that the ESD protection device 200 includes two thyristors each including two BJTs, and the operating principle of the ESD protection device 200 is also the same as that of the ESD protection devices 100 described with reference to FIGS. 1 to 14. Thus, additional description will be omitted to avoid redundancy.

Figure 19:
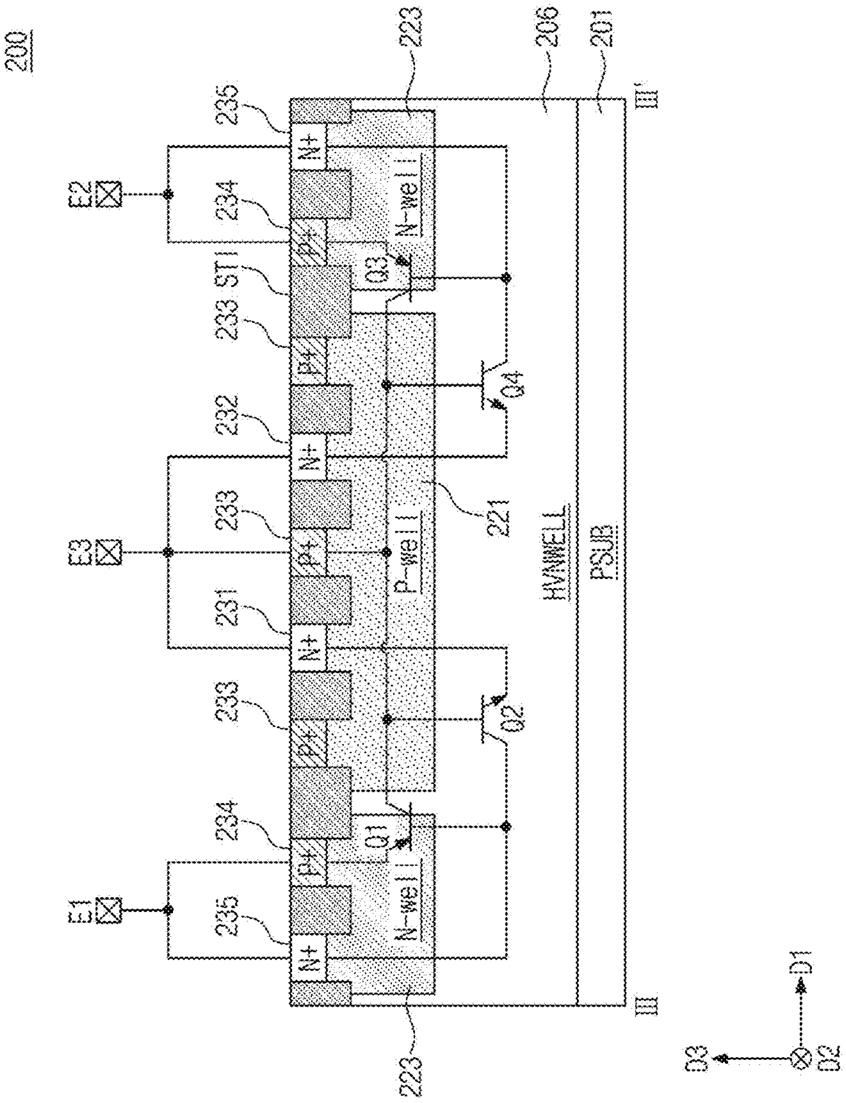
FIG. 19 illustrates a cross-sectional view of an ESD protection device taken along line III-III' of FIG. 17.

FIG. 19 illustrates a cross-sectional view of the ESD protection device 200 taken along line III-III' of FIG. 17.

The ESD protection device 200 of FIG. 19 may be mostly similar to the ESD protection device 200 of FIG. 18. However, the ESD protection device 200 of FIG. 19 may not include the resistors R1, R2, R3, and R4 of FIG. 18, which make the triggering of the thyristor easy. Instead, a resistance value sufficient to make the triggering of the thyristor easy may be implemented only with self-resistances of metal interconnections and/or vias for electrically connecting the electrodes E1, E2, and E3 and the diffusion regions 231 to 235. In this case, the resistors R1, R2, R3, and R4 illustrated in FIG. 18 may not be required.

Figure 20:
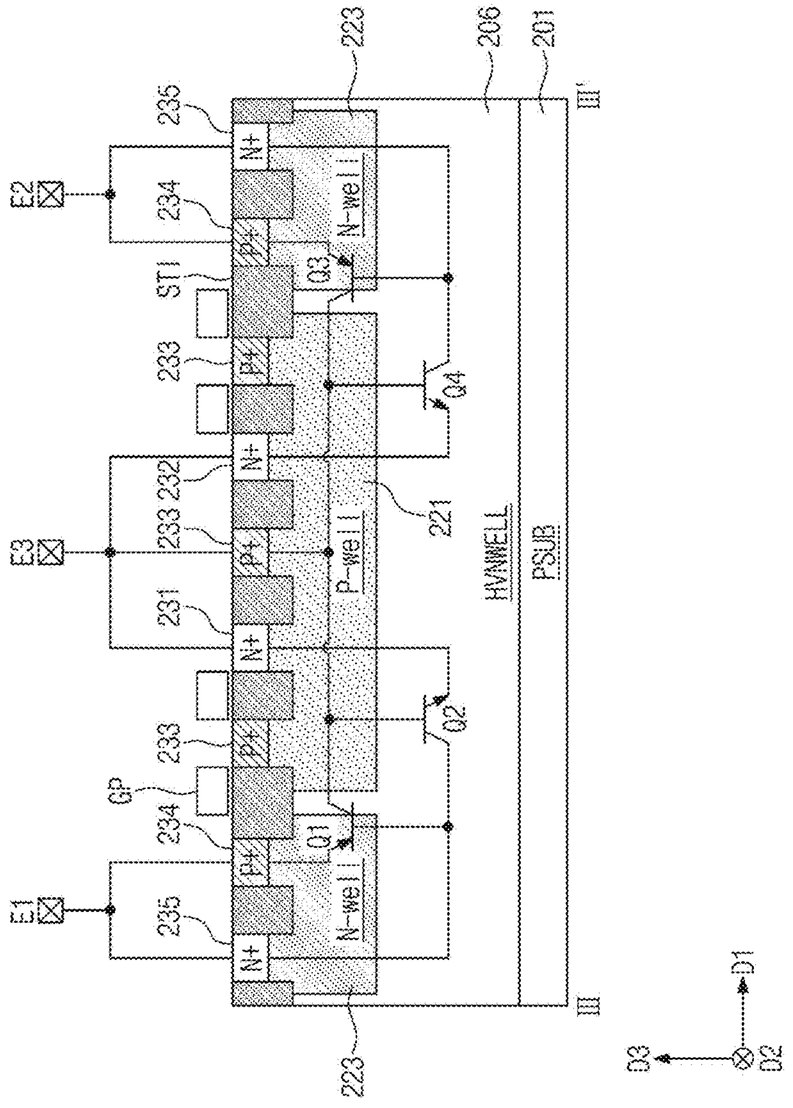
FIG. 20 illustrates a cross-sectional view of an ESD protection device taken along line III-III' of FIG. 17.

FIG. 20 illustrates a cross-sectional view of an ESD protection device 200 taken along line III-III' of FIG. 17.

The ESD protection device 200 of FIG. 20 may be mostly similar to the ESD protection device 200 of FIG. 18. However, the ESD protection device 200 of FIG. 20 may further include gate polysilicon patterns GP formed through the CMOS process, compared to the ESD protection device 200 of FIG. 18. For example, a gate electrode illustrated in FIG. 20 may be a dummy gate electrode. The gate polysilicon pattern GP may have a self-resistance and may cause a voltage drop when the ESD current (or voltage) is introduced.

Figure 21:
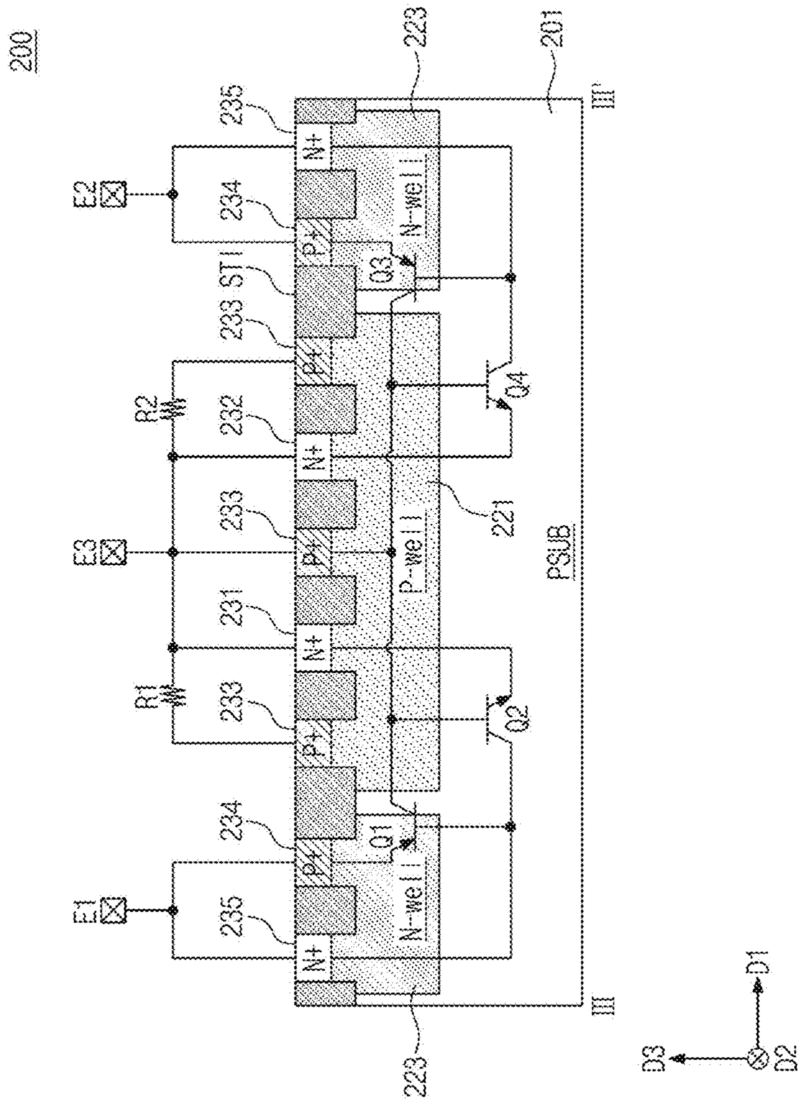
FIG. 21 illustrates a cross-sectional view of an ESD protection device taken along line III-III' of FIG. 17.
Figure 22:
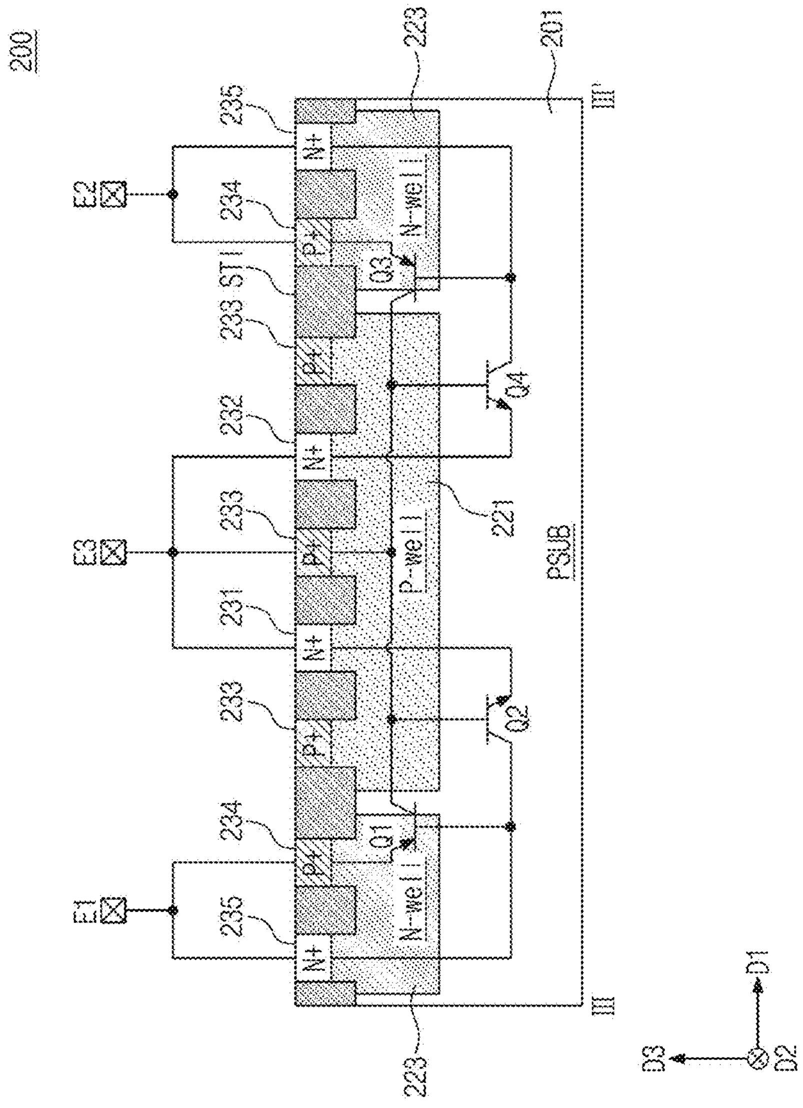
FIG. 22 illustrates a cross-sectional view of an ESD protection device taken along line III-III' of FIG. 17.
Figure 23:
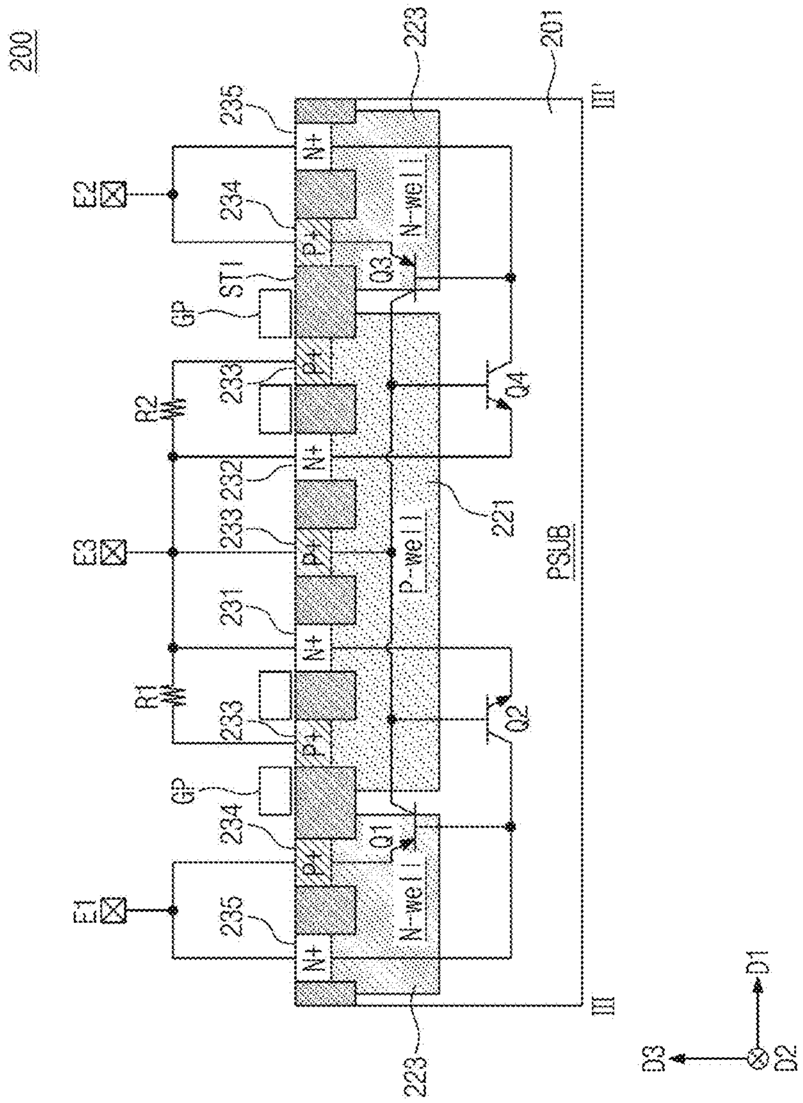
FIG. 23 illustrates a cross-sectional view of an ESD protection device taken along line III-III' of FIG. 17.

FIG. 21 illustrates a cross-sectional view of an ESD protection device 200 taken along line III-III' of FIG. 17. FIG. 22 illustrates a cross-sectional view of the ESD protection device 200 taken along line III-III' of FIG. 17. FIG. 23 illustrates a cross-sectional view of an ESD protection device 200 taken along line III-III' of FIG. 17. The ESD protection devices 200 of FIGS. 21 to 23 may be mostly similar to the ESD protection devices 200 of FIGS. 18 and 20. However, the ESD protection devices 200 of FIGS. 18 to 210 differ from the ESD protection devices 200 of FIGS. 18 and 20 in that the P-well 221 and the N-well 223 are formed on the substrate 201 without including the N-well 206, and additional description will be omitted to avoid redundancy.

Figure 24:
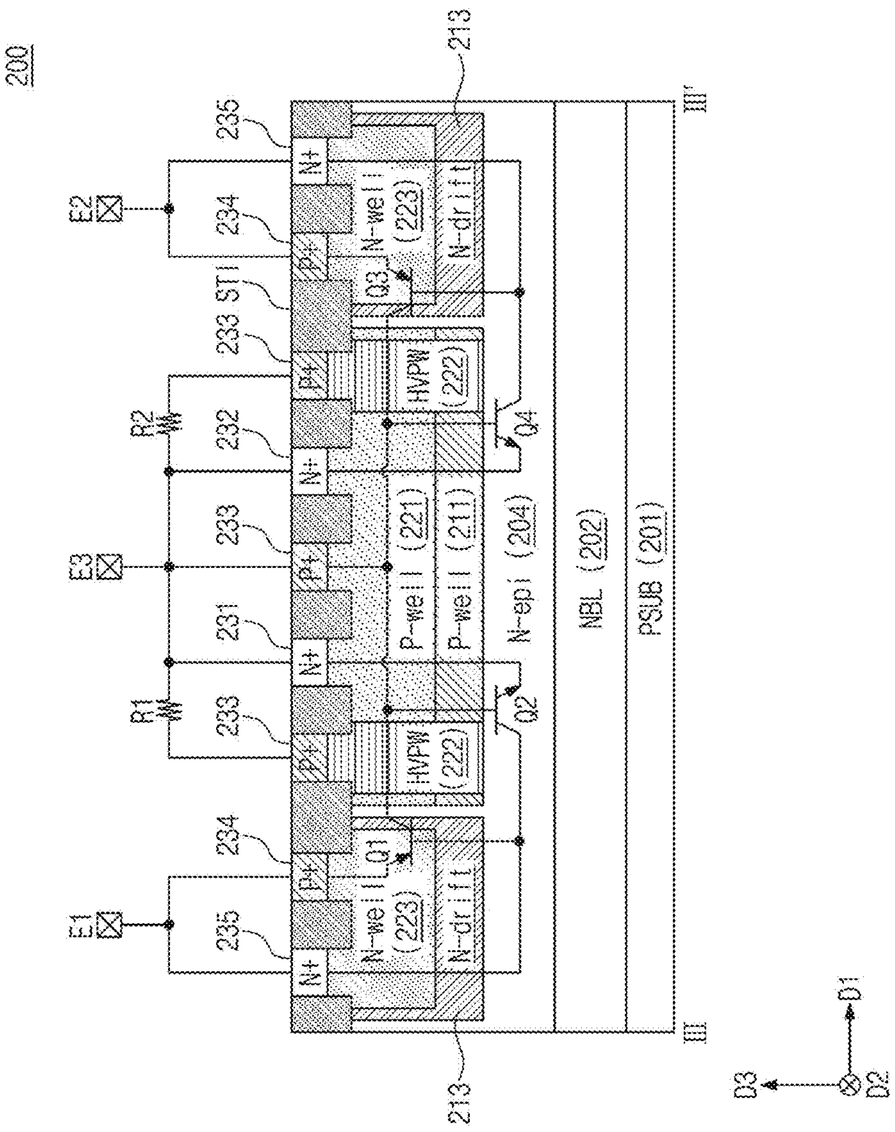
FIG. 24 illustrates a cross-sectional view of an ESD protection device taken along line III-III' of FIG. 17.

FIG. 24 illustrates a cross-sectional view of the ESD protection device 200 taken along line III-III' of FIG. 17.

Referring to FIGS. 17 and 24, the ESD protection device 200 may include the substrate 201, a buried layer 202, an epitaxial layer 204, a P-type drift region 211, an N-type drift region 213, the P-well 221, a P-well 222, the N-well 223, and the diffusion regions 231 to 235.

The substrate 201 may be a semiconductor substrate such as a semiconductor wafer. The epitaxial layer 204 may be formed on the substrate 201. The epitaxial layer 204 may be formed on the substrate 201 through selective epitaxial growth or solid phase epitaxial growth. The substrate 201 may have a low-concentration P-type conductivity, and the epitaxial layer 204 may have a low-concentration N-type conductivity. The buried layer 202 may be formed between the epitaxial layer 204 and the substrate 201. The buried layer 202 may be formed by injecting N-type impurities (i.e., dopant) of a low concentration between the substrate 201 and the epitaxial layer 204.

The P-well 221 and the N-well 223 may be formed on the epitaxial layer 204. The N-well 223 may be formed on the epitaxial layer 204 to surround the P-well 221 in a plan view. The P-type drift region 211 may be formed on a lower portion of the P-well 221, and the N-type drift region 213 may be formed on a lower portion of the N-well 223. The N-type drift region 213 may be formed on the epitaxial layer 204 to surround the P-type drift region 211 in a plan view. The P-well 221 and the N-well 223 may be doped with impurities of a relatively high concentration, and the P-type drift region 211 and the N-type drift region 213 may be doped with impurities of a concentration lower than the concentration of the P-well 221 and the N-well 223.

The P-well 222 may be formed in the P-well 221 and the P-type drift region 211. The P-well 222 may be formed to be similar in shape to the third diffusion region 233 illustrated in FIG. 17 in a plan view. For example, the doping concentration of the P-well 222 may be lower than the doping concentration of the P-well 221 and the P-type drift region 211.

The first diffusion region 231 and the second diffusion region 232 may be formed on the P-well 221, and the third diffusion region 233 may be formed on the P-well 221 to surround the first diffusion region 231 and the second diffusion region 232 in a plan view. The first diffusion region 231 and the second diffusion region 232 may be doped with N-type impurities of a higher concentration than the P-well 221, and the third diffusion region 233 may be doped with P-type impurities of a higher concentration than the P-well 221.

The fourth diffusion region 234 may be formed on the N-well 223 to surround the third diffusion region 233, and the fifth diffusion region 235 may be formed on the N-well 223 to surround the fourth diffusion region 234. The fourth diffusion region 234 may be doped with P-type impurities of a higher concentration than the N-well 223, and the fifth diffusion region 235 may be doped with N-type impurities of a higher concentration than the N-well 223.

Referring to an equivalent circuit diagram illustrated in FIG. 24, the fourth diffusion region (e.g., an emitter) 234 connected to the first electrode E1, the N-well (e.g., a base) 223, and the P-well (e.g., a collector) 221 may constitute a PNP transistor Q1. The N-well (e.g., a collector) 223 connected to the first electrode E1 through the diffusion regions 234 and 235, the P-well (e.g., a base) 221, and the first diffusion region (e.g., an emitter) 231 may constitute an NPN transistor Q2.

The fourth diffusion region (e.g., an emitter) 234 connected to the second electrode E2, the N-well (e.g., a base) 223, and the P-well (e.g., a collector) 221 may constitute a PNP transistor Q3, and the N-well (e.g., a collector) 223 connected to the second electrode E2 through the diffusion regions 234 and 235, the P-well (e.g., a base) 221, and the first diffusion region (e.g., an emitter) 232 may constitute an NPN transistor Q4.

Figure 25:
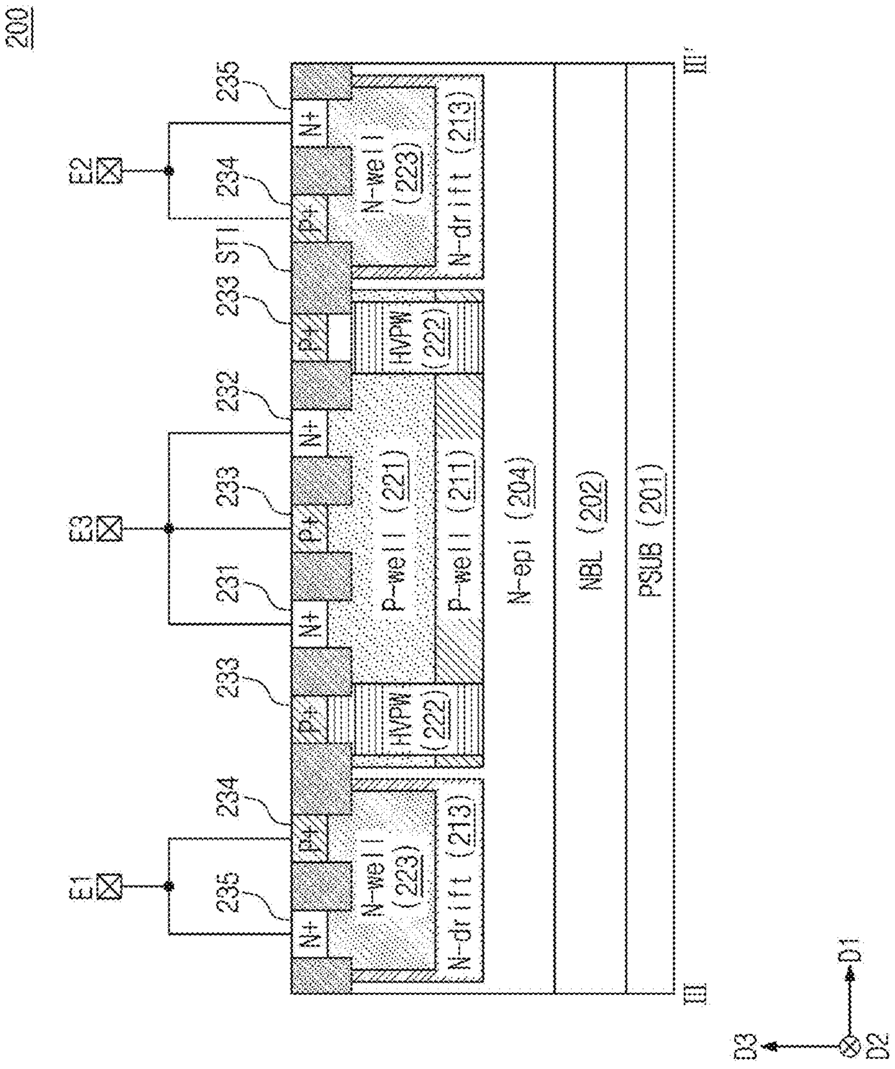
FIG. 25 illustrates a cross-sectional view of an ESD protection device taken along line III-III' of FIG. 17.

FIG. 25 illustrates a cross-sectional view of the ESD protection device 200 taken along line III-III' of FIG. 17.

The ESD protection device 200 of FIG. 25 may be mostly similar to the ESD protection device 200 of FIG. 24. However, the ESD protection device 200 of FIG. 25 may not include the resistors R1 and R2 of FIG. 24, which make the triggering of the thyristor easy. Instead, a resistance value sufficient to make the triggering of the thyristor easy may be implemented only with self-resistances of metal interconnections and/or vias for electrically connecting the electrodes E1, E2, and E3 and the diffusion regions 231 to 235. In this case, the resistors R1 and R2 illustrated in FIG. 24 may not be required.

Figure 26:
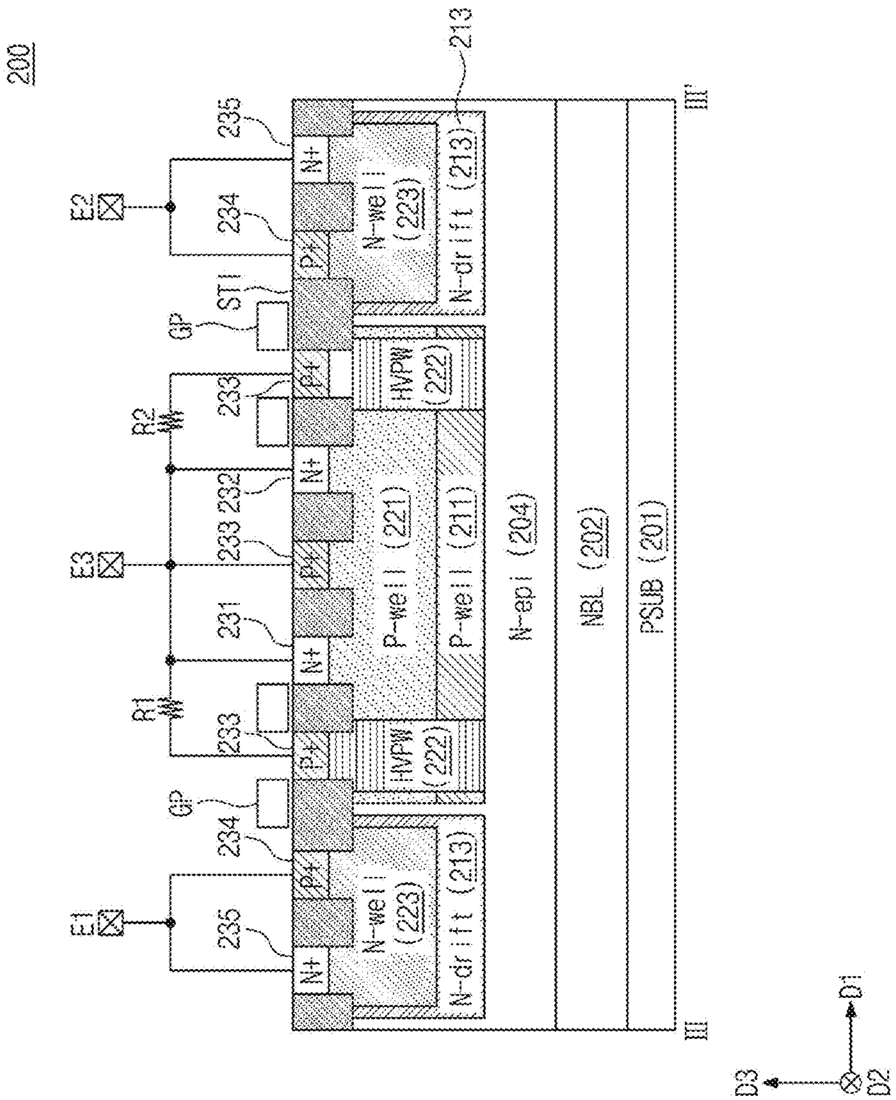
FIG. 26 illustrates a cross-sectional view of an ESD protection device taken along line III-III' of FIG. 17.

FIG. 26 illustrates a cross-sectional view of an ESD protection device 200 taken along line III-III' of FIG. 17.

The ESD protection device 200 of FIG. 26 may be mostly similar to the ESD protection device 200 of FIG. 24. However, the ESD protection device 200 of FIG. 26 may further include dummy gate electrodes (i.e., gate polysilicon patterns GP) formed through the CMOS process, compared to the ESD protection device 200 of FIG. 24. The gate polysilicon pattern GP may have a self-resistance and may cause a voltage drop when the ESD current (or voltage) is introduced.

Figure 27:
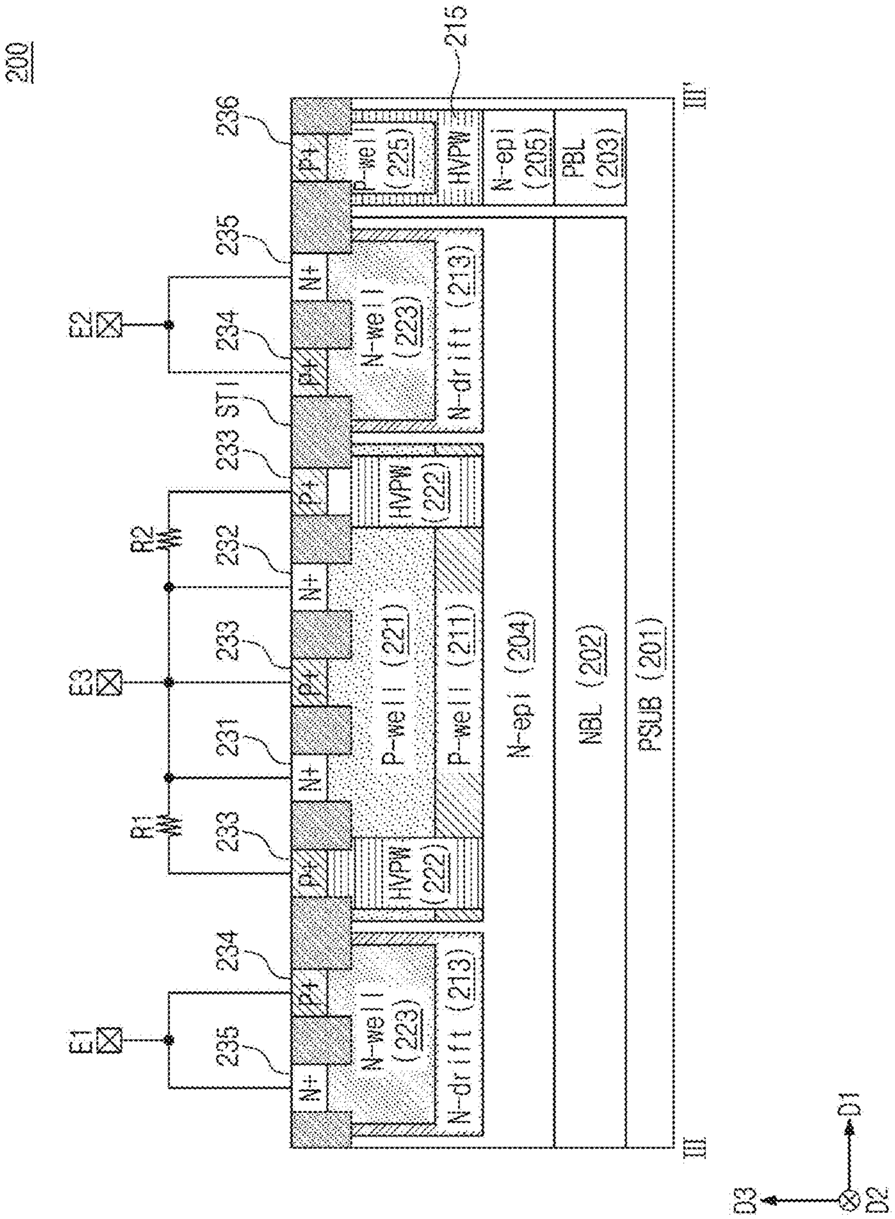
FIG. 27 illustrates a cross-sectional view of an ESD protection device taken along line III-III' of FIG. 17.

FIG. 27 illustrates a cross-sectional view of an ESD protection device 200 taken along line III-III' of FIG. 17.

The ESD protection device 200 of FIG. 27 may be mostly similar to the ESD protection device 200 of FIG. 24. Thus, additional description will be omitted to avoid redundancy. Compared to the ESD protection device 200 of FIG. 24, the ESD protection device 200 of FIG. 27 may further include a buried layer 203, an epitaxial layer 205, a P-well 215, a P-well 225, and a sixth diffusion region 236. Although the above components are not illustrated in FIG. 17, this may be understood as being formed in a region outside the outermost shallow trench isolation STI of FIG. 17.

The epitaxial layer 205 may be formed on the substrate 201, and the buried layer 203 doped with P-type impurities of a high concentration may be formed between the substrate 201 and the epitaxial layer 205. The buried layer 203, the epitaxial layer 205, the P-well 215, the P-well 225, and the sixth diffusion region 236 may constitute the guard ring GR, and the guard ring GR may prevent a latch-up phenomenon in which the ESD current introduced to the ESD protection device 200 is discharged to the outside.

Meanwhile, it is possible to connect the cells described with reference to FIGS. 17 to 27 in series. For example, the cells of FIGS. 17 to 27 may be connected to be similar to the manner described with reference to FIGS. 15 and 16. For example, the capacity of the ESD current that an ESD protection device is capable of discharging may increase by electrically connecting a cathode electrode of a first cell to an anode electrode of a second cell adjacent to the first cell.

Figure 28:
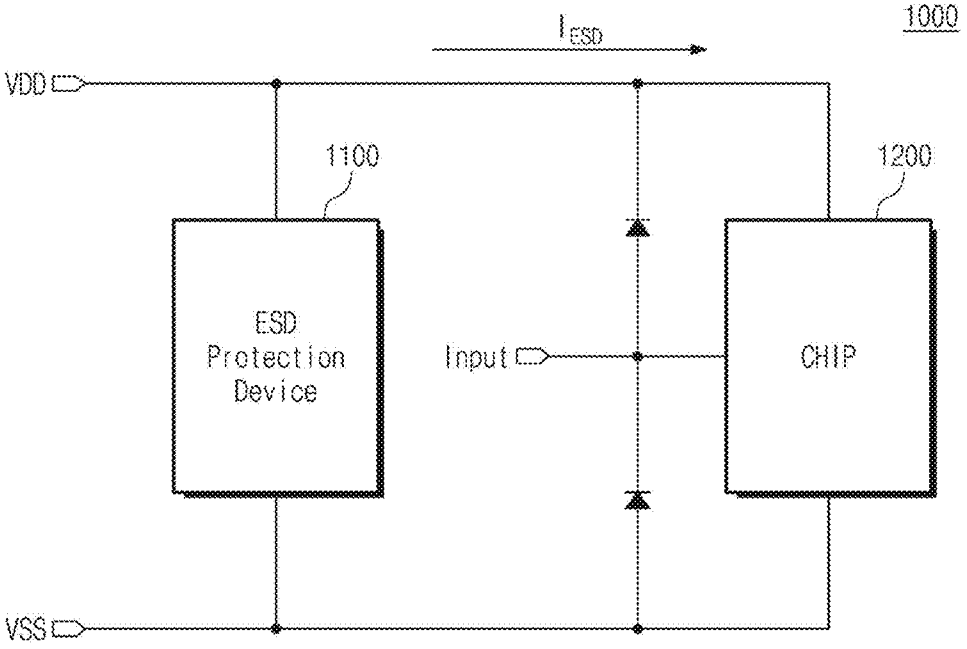
FIG. 28 illustrates a configuration of an electronic device including an ESD protection device of the present disclosure.

FIG. 28 illustrates a configuration of an electronic device 1000 including an ESD protection device 1100 of the present disclosure.

The electronic device 1000 may include the ESD protection device 1100 and a semiconductor chip 1200. When the electronic device 1000 is powered on or operates, a power supply voltage VDD may be supplied to the semiconductor chip 1200. An ESD current IESD may occur due to various factors. In this case, as the ESD protection device 1100 operates, the ESD current IESD may flow to an electrode, to which a ground voltage VSS is applied, through the ESD protection device 1100.

Figure 29:
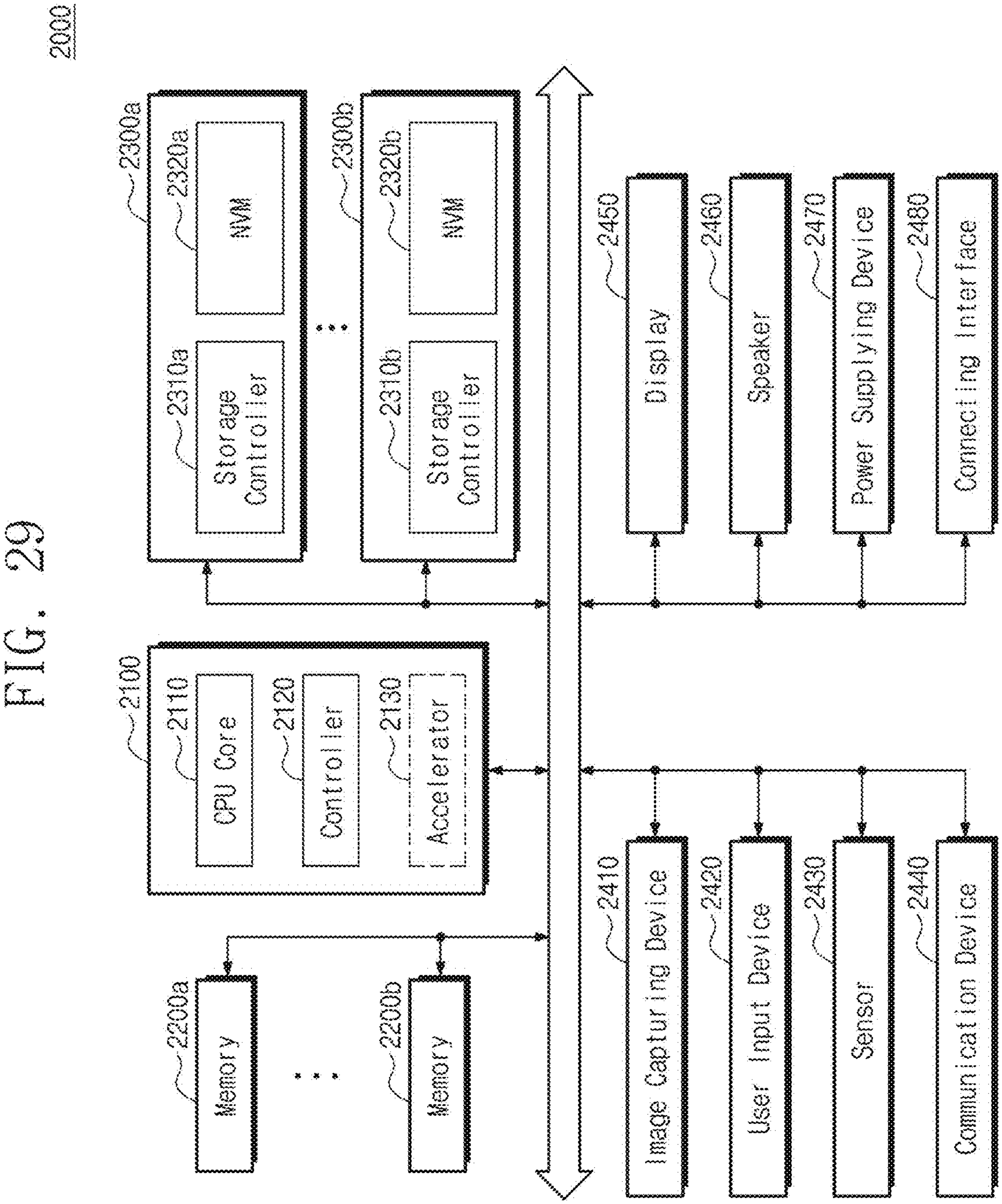
FIG. 29 illustrates a configuration of a system including an ESD protection device of the present disclosure.

FIG. 29 is a diagram of a system 2000 which includes the ESD protection device according to an embodiment.

Referring to FIG. 29, the system 2000 may include a main processor 2100, memories (e.g., 2200*a* and 2200*b*), and storage devices (e.g., 2300*a* and 2300*b*). In addition, the system 2000 may include at least one of an image capturing device 2410, a user input device 2420, a sensor 2430, a communication device 2440, a display 2450, a speaker 2460, a power supplying device 2470, and a connecting interface 2480.

The main processor 2100 may control all operations of the system 2000, more specifically, operations of other components included in the system 2000. The main processor 2100 may be implemented as a general-purpose processor, a dedicated processor, or an application processor.

The main processor 2100 may include at least one CPU core 2110 and further include a controller 2120 configured to control the memories 2200*a* and 2200*b* and/or the storage devices 2300*a* and 2300*b*. In some embodiments, the main processor 2100 may further include an accelerator 2130, which is a dedicated circuit for a high-speed data operation, such as an artificial intelligence (AI) data operation. The accelerator 2130 may include a graphics processing unit (GPU), a neural processing unit (NPU) and/or a data processing unit (DPU) and be implemented as a chip that is physically separate from the other components of the main processor 2100.

The memories 2200*a* and 2200*b* may be used as main memory devices of the system 2000. Although each of the memories 2200*a* and 2200*b* may include a volatile memory, such as static random access memory (SRAM) and/or dynamic RAM (DRAM), each of the memories 2200*a* and 2200*b* may include non-volatile memory, such as a flash memory, phase-change RAM (PRAM) and/or resistive RAM (RRAM). The memories 2200*a* and 2200*b* may be implemented in the same package as the main processor 2100.

The storage devices 2300*a* and 2300*b* may serve as non-volatile storage devices configured to store data regardless of whether power is supplied thereto, and have larger storage capacity than the memories 2200*a* and 2200*b*. The storage devices 2300*a* and 2300*b* may respectively include storage controllers (STRG CTRL) 2310*a* and 2310*b* and NVMs (Non-Volatile Memory) 2320*a* and 2320*b* configured to store data via the control of the storage controllers 2310*a* and 2310*b*. Although the NVMs 2320*a* and 2320*b* may include flash memories having a two-dimensional (2D) structure or a three-dimensional (3D) V-NAND structure, the NVMs 2320*a* and 2320*b* may include other types of NVMs, such as PRAM and/or RRAM.

The storage devices 2300*a* and 2300*b* may be physically separated from the main processor 2100 and included in the system 2000 or implemented in the same package as the main processor 2100. In addition, the storage devices 2300*a* and 2300*b* may have types of solid-state devices (SSDs) or memory cards and may be removably combined with other components of the system 2000 through an interface, such as the connecting interface 2480 that will be described below. The storage devices 2300*a* and 2300*b* may be devices to which a standard protocol, such as a universal flash storage (UFS), an embedded multi-media card (eMMC), or a non-volatile memory express (NVMe), is applied, without being limited thereto.

The image capturing device 2410 may capture still images or moving images. The image capturing device 2410 may include, e.g., a camera, a camcorder, and/or a webcam.

The user input device 2420 may receive various types of data input by a user of the system 2000 and may include, e.g., a touch pad, a keypad, a keyboard, a mouse, and/or a microphone.

The sensor 2430 may detect various types of physical quantities, which may be obtained from the outside of the system 2000, and convert the detected physical quantities into electric signals. The sensor 2430 may include, e.g., a temperature sensor, a pressure sensor, an illuminance sensor, a position sensor, an acceleration sensor, a biosensor, and/or a gyroscope sensor.

The communication device 2440 may transmit and receive signals between other devices outside the system 2000 according to various communication protocols. The communication device 2440 may include, e.g., an antenna, a transceiver, and/or a modem.

The display 2450 and the speaker 2460 may serve as output devices configured to respectively output visual information and auditory information to the user of the system 2000.

The power supplying device 2470 may appropriately convert a power supplied from a battery (not illustrated) embedded in the system 2000 and/or an external power source to be supplied to each component of the system 2000. For example, the power supplying device 2470 may include at least one power management integrated circuit (PMIC). The power supplying device 2470 may include the ESD protection device described with reference to FIGS. 1 to 27.

The connecting interface 2480 may provide the connection between the system 2000 and an external device, which is connected with the system 2000 to exchange data with the system 2000. The connecting interface 2480 may be implemented with various interfaces, such as an Advanced Technology Attachment (ATA) interface, a Serial ATA (SATA) interface, an external SATA (e-SATA) interface, a Small Computer System Interface (SCSI) interface, a Serial Attached SCSI (SAS) interface, a Peripheral Component Interconnection (PCI) interface, a PCI express (PCIe) interface, an NVM express (NVMe) interface, an IEEE 1394 interface, an Universal Serial Bus (USB) interface, a Secure Digital (SD) card interface, a Multi-Media Card (MMC) interface, an embedded Multi-Media Card (eMMC) interface, a Universal Flash Storage (UFS) interface, an embedded Universal Flash Storage (eUFS) interface, and a Compact Flash (CF) card interface.

According to an electrostatic discharge protection device of the present disclosure, an ESD current of a high value may be efficiently discharged.

While the present disclosure has been described with reference to embodiments thereof, it will be apparent to those of ordinary skill in the art that various changes and modifications may be made thereto without departing from the spirit and scope of the present invention.

What is claimed is:

1. An electrostatic discharge protection device comprising:

a substrate having a first conductivity type;

a first well formed on the substrate and having the first conductivity type;

a second well formed on the substrate surrounding the first well in a plan view, the second well having a second conductivity type;

a first diffusion region formed on the first well and having the first conductivity type;

a second diffusion region formed on the first well surrounding the first diffusion region in the plan view, the second diffusion region having the second conductivity type;

a third diffusion region formed on the first well and having the first conductivity type;

a fourth diffusion region formed on the first well surrounding the third diffusion region in the plan view, the fourth diffusion region having the second conductivity type;

a fifth diffusion region formed on the first well surrounding the second diffusion region and the fourth diffusion region in the plan view, the fifth diffusion region having the first conductivity type;

a sixth diffusion region formed on the second well to surround the fifth diffusion region in the plan view, the sixth diffusion region having the first conductivity type; and a seventh diffusion region formed on the second well surrounding the sixth diffusion region in the plan view, the seventh diffusion region having the second conductivity type, wherein the sixth diffusion region and the seventh diffusion region are connected to a first electrode, and the first diffusion region to the fifth diffusion region are connected to a second electrode.

2. The electrostatic discharge protection device of claim 1, wherein the first conductivity type is a P-type conductivity, and the second conductivity type is an N-type conductivity.

3. The electrostatic discharge protection device of claim 1, further comprising:

a first resistor connected between the second diffusion region and the fifth diffusion region; and a second resistor connected between the fourth diffusion region and the fifth diffusion region.

4. The electrostatic discharge protection device of claim 1, further comprising:

a gate polysilicon pattern formed on at least one from among: a region between the second diffusion region and the fifth diffusion region, a region between the fourth diffusion region and the fifth diffusion region, and a region between the fifth diffusion region and the sixth diffusion region.

5. The electrostatic discharge protection device of claim 1, wherein the substrate further includes:

an epitaxial layer of the second conductivity type; and a buried layer formed on a lower portion of the epitaxial layer.

6. The electrostatic discharge protection device of claim 5, further comprising:

a first drift region formed on a lower portion of the first well and having the first conductivity type;

a second drift region formed on a lower portion of the second well and having the second conductivity type; and a first deep-well formed under the fifth diffusion region in the first well and in the first drift region, the first deep-well having the first conductivity type.

7. The electrostatic discharge protection device of claim 6, wherein a doping concentration of the first well is higher than a doping concentration of the first drift region, wherein a doping concentration of the second well is higher than a doping concentration of the second drift region, and wherein a doping concentration of the first deep-well is lower than the doping concentration of the first drift region.

8. The electrostatic discharge protection device of claim 6, further comprising:

a first resistor connected between the second diffusion region and the fifth diffusion region; and a second resistor connected between the fourth diffusion region and the fifth diffusion region.

9. The electrostatic discharge protection device of claim 6, further comprising a gate polysilicon pattern formed on at least one from among: a region between the second diffusion region and the fifth diffusion region, a region between the fourth diffusion region and the fifth diffusion region, and a region between the fifth diffusion region and the sixth diffusion region.

10. The electrostatic discharge protection device of claim 6, wherein the epitaxial layer is a first epitaxial layer, and the buried layer is a first buried layer, wherein the substrate further includes:

a second epitaxial layer of the second conductivity type;

a second buried layer formed on a lower portion of the second epitaxial layer;

a second deep-well formed on the second epitaxial layer and having the first conductivity type; and a seventh well formed on the second deep-well and having the first conductivity type.

11. The electrostatic discharge protection device of claim 1, wherein the first electrode is an anode electrode, and the second electrode is a cathode electrode.

12. An electrostatic discharge protection device comprising:

a substrate of a first conductivity type;

a first well formed on the substrate and having the first conductivity type;

a second well formed on the substrate surrounding the first well in a plan view and isolated from the first well, the second well having a second conductivity type;

a first diffusion region and a second diffusion region formed on the first well and having the second conductivity type;

a third diffusion region formed on the first well surrounding the first diffusion region and the second diffusion region in the plan view, the third diffusion region having the first conductivity type;

a fourth diffusion region formed on the second well surrounding the third diffusion region in the plan view, the fourth diffusion region having the first conductivity type; and a fifth diffusion region formed on the second well surrounding the fourth diffusion region in the plan view, the fifth diffusion region having the second conductivity type, wherein the fourth diffusion region and the fifth diffusion region are connected to a first electrode, and the first diffusion region to the third diffusion region are connected to a second electrode.

13. The electrostatic discharge protection device of claim 12, wherein the first conductivity type is a P-type conductivity, and the second conductivity type is an N-type conductivity.

14. The electrostatic discharge protection device of claim 12, further comprising:

a first resistor connected between the first diffusion region and the third diffusion region; and a second resistor connected between the second diffusion region and the third diffusion region.

15. The electrostatic discharge protection device of claim 12, further comprising:

a gate polysilicon pattern formed on at least one from among: a region between the first diffusion region and the third diffusion region, a region between the second diffusion region and the third diffusion region, and a region between the third diffusion region and the fourth diffusion region.

16. The electrostatic discharge protection device of claim 12, further comprising:

a first drift region formed on a lower portion of the first well and having the first conductivity type;

a second drift region formed on a lower portion of the second well and having the second conductivity type; and a first deep-well formed under the third diffusion region in the first well, the first deep-well having the first conductivity type, wherein the substrate further includes:

an epitaxial layer of the second conductivity type; and a buried layer formed on a lower portion of the epitaxial layer.

17. The electrostatic discharge protection device of claim 16, wherein a doping concentration of the first well is higher than a doping concentration of the first drift region, wherein a doping concentration of the second well is higher than a doping concentration of the second drift region, and wherein a doping concentration of the first deep-well is lower than the doping concentration of the first drift region.

18. The electrostatic discharge protection device of claim 16, further comprising:

a first resistor connected between the first diffusion region and the third diffusion region; and a second resistor connected between the second diffusion region and the third diffusion region.

19. An electrostatic discharge protection device comprising:

a first well formed on a substrate and having a first conductivity type;

a second well formed on the substrate surrounding the first well in a plan view, the second well having a second conductivity type;

a first diffusion region and a second diffusion region formed on the first well and having the second conductivity type;

a third diffusion region formed on the first well surrounding the first diffusion region and the second diffusion region in the plan view, the third diffusion region having the first conductivity type;

a fourth diffusion region formed on the second well surrounding the third diffusion region in the plan view, the fourth diffusion region having the first conductivity type;

a fifth diffusion region formed on the second well surrounding the fourth diffusion region in the plan view, the fifth diffusion region having the second conductivity type;

a third well formed on the substrate and having the first conductivity type;

a fourth well formed on the substrate surrounding the third well in the plan view, the fourth well having the second conductivity type;

a sixth diffusion region and a seventh diffusion region formed on the third well and having the second conductivity type;

an eighth diffusion region formed on the third well surrounding the sixth diffusion region and the seventh diffusion region in the plan view, the eighth diffusion region having the first conductivity type;

a ninth diffusion region formed on the fourth well surrounding the eighth diffusion region in the plan view, the ninth diffusion region having the first conductivity type; and a tenth diffusion region formed on the fourth well surrounding the ninth diffusion region in the plan view, the tenth diffusion region having the second conductivity type, wherein the first diffusion region, the second diffusion region, the third diffusion region, the ninth diffusion region, and the tenth diffusion region are electrically connected to each other, and wherein the fourth diffusion region and the fifth diffusion region are connected to a first electrode, and the sixth diffusion region and the seventh diffusion region are connected to a second electrode.

20. The electrostatic discharge protection device of claim 19, wherein the first conductivity type is a P-type conductivity, and the second conductivity type is an N-type conductivity.

* * * * *